(12) United States Patent
Nakamura et al.

(10) Patent No.: US 11,831,302 B2
(45) Date of Patent: Nov. 28, 2023

(54) DRIVE CIRCUIT FOR SWITCH

(71) Applicant: DENSO CORPORATION, Kariya (JP)

(72) Inventors: Yuuta Nakamura, Kariya (JP); Yasuaki Aoki, Kariya (JP); Hideji Yoshida, Kariya (JP); Takashi Yoshiya, Kariya (JP); Tomohiro Nezuka, Kariya (JP); Akimasa Niwa, Kariya (JP)

(73) Assignee: DENSO CORPORATION, Kariya (JP)

( * ) Notice: Subject to any disclaimer, the term of this patent is extended or adjusted under 35 U.S.C. 154(b) by 75 days.

(21) Appl. No.: 17/550,887

(22) Filed: Dec. 14, 2021

(65) Prior Publication Data

US 2022/0109438 A1    Apr. 7, 2022

Related U.S. Application Data

(63) Continuation of application No. PCT/JP2020/022754, filed on Jun. 9, 2020.

(30) Foreign Application Priority Data

Jun. 14, 2019  (JP) ................. 2019-111155

(51) Int. Cl.
*H03K 17/042* (2006.01)
*H02M 1/08* (2006.01)
(Continued)

(52) U.S. Cl.
CPC .... *H03K 17/04206* (2013.01); *H02M 1/0009* (2021.05); *H02M 1/08* (2013.01); *H02M 7/537* (2013.01); *H03K 17/687* (2013.01)

(58) Field of Classification Search
None
See application file for complete search history.

(56) References Cited

U.S. PATENT DOCUMENTS 8,258,763 B2 * 9/2012 Nakamura ............. H02M 1/32
323/299
10,742,209 B2 * 8/2020 Trescases ............. H03K 17/687
(Continued)

FOREIGN PATENT DOCUMENTS

JP   2008-232735 A   10/2008
JP   4284575 B2      6/2009
(Continued)

OTHER PUBLICATIONS

Aug. 4, 2020 Search Report issued in International Patent Application No. PCT/JP2020/022754.

*Primary Examiner* — Kenneth B Wells
(74) *Attorney, Agent, or Firm* — Oliff PLC

(57) ABSTRACT

A drive circuit drives a switch configuring a power converter. The drive circuit divides an inter-terminal voltage of a switch. The drive circuit includes a differential circuit having first and second input terminals to which the divided inter-terminal voltages are inputted. The differential circuit outputs an analog voltage based on a voltage difference between the input terminals. The differential circuit executes reset of the output voltage, and with the voltage difference when reset is canceled after reset is executed as a reference voltage, outputs an analog voltage in which an amount of change from the reference voltage is multiplied by an amplification factor. The drive circuit outputs a binary signal based on comparison results between a threshold and the analog voltage outputted from the differential circuit, and sets a transfer rate of a gate charge of the switch when a driving state is switched, based on the output signal thereof.

28 Claims, 18 Drawing Sheets

(51) Int. Cl.
*H02M 1/00* (2006.01)
*H02M 7/537* (2006.01)
*H03K 17/687* (2006.01)

(56) References Cited

U.S. PATENT DOCUMENTS

| | | | |
|---|---|---|---|
| 11,075,627 B2* | 7/2021 | Trescases | H03K 17/687 |
| 11,335,272 B2* | 5/2022 | Lee | G09G 3/3291 |
| 2008/0150516 A1 | 6/2008 | Yonezawa | |
| 2020/0021282 A1 | 1/2020 | Yamamoto et al. | |

FOREIGN PATENT DOCUMENTS

| | | |
|---|---|---|
| JP | 2010-119184 A | 5/2010 |
| JP | 2018-153007 A | 9/2018 |

* cited by examiner

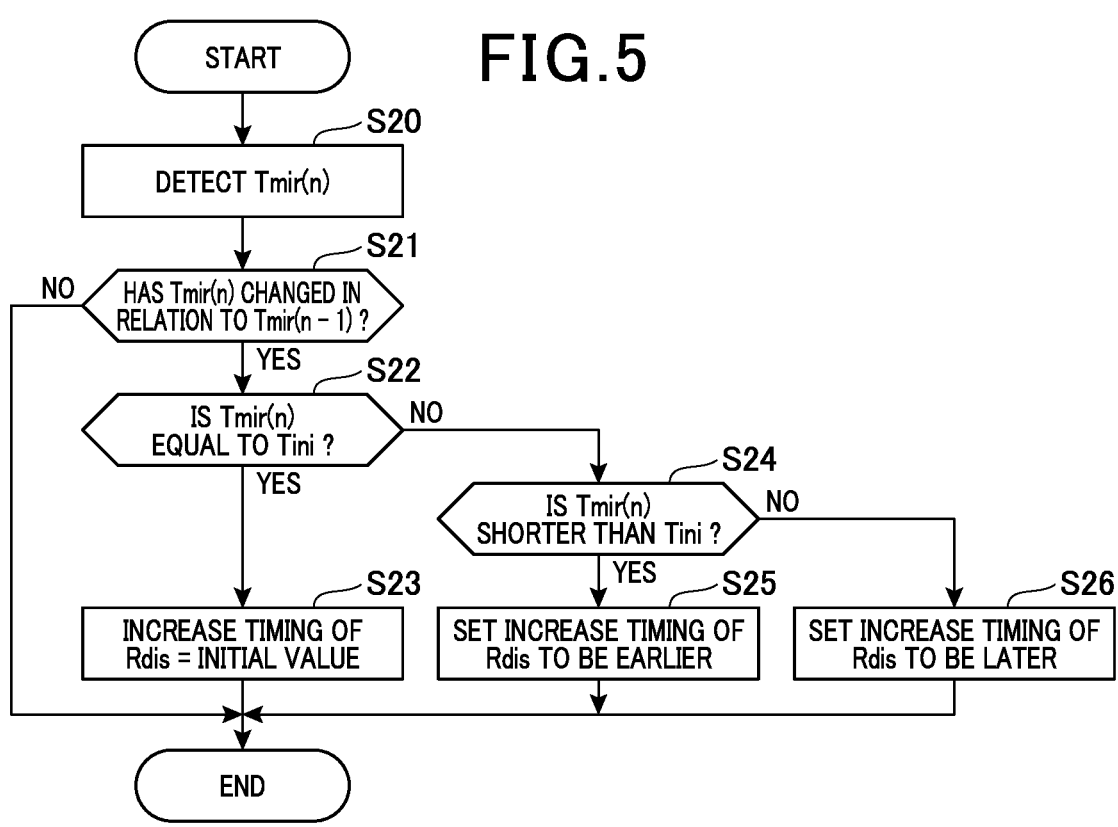
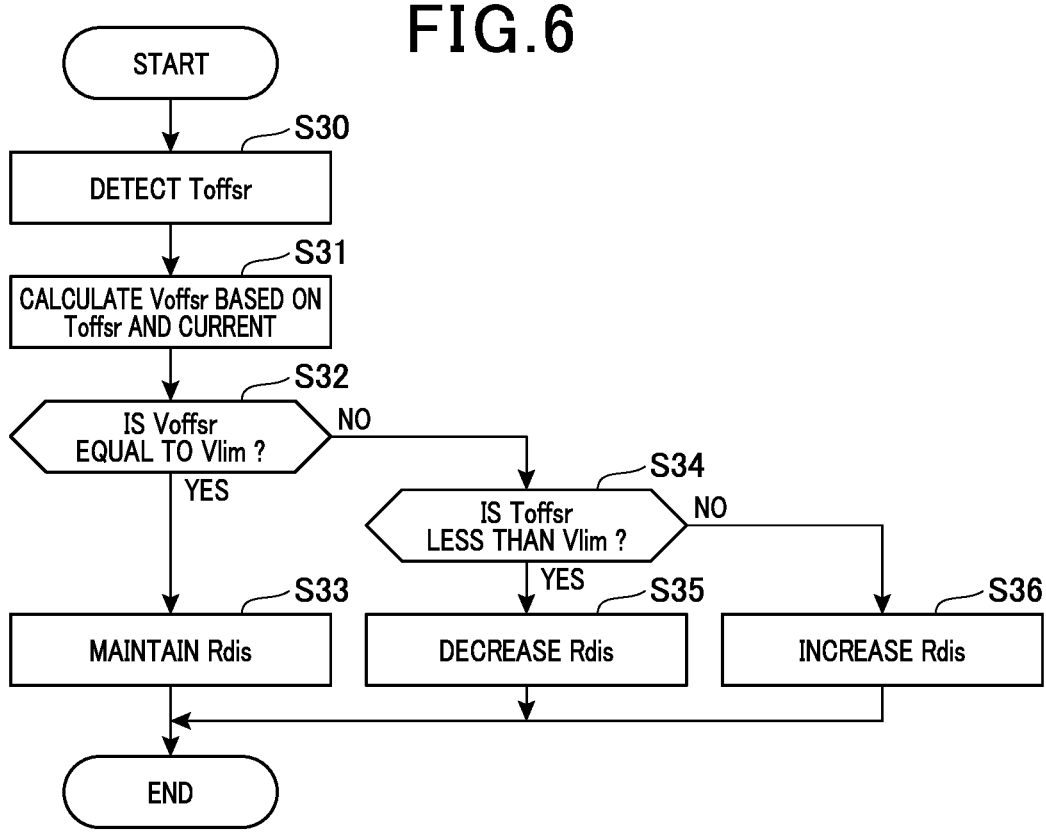

FIG.22

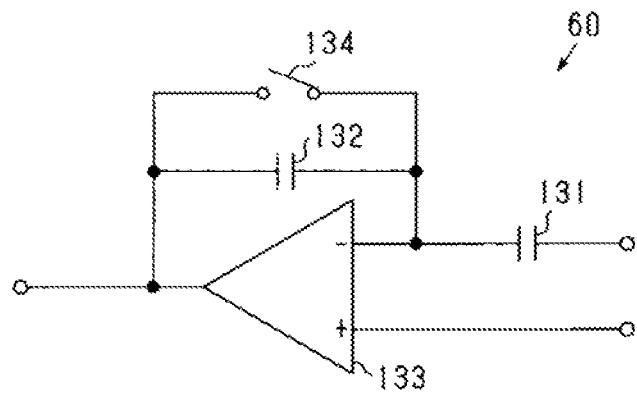

FIG.23

```
                                                              ┌─56
┌──────────────────────────────────────────────────────────────┐
│ VOLTAGE TRANSITION PERIOD OR SURGE CONVERGENCE PERIOD < OFF-COMMAND PERIOD │
│                                       →RESET PROHIBITED AND MASKING PROCESS │
│                                                                           │
│ VOLTAGE TRANSITION PERIOD OR SURGE CONVERGENCE PERIOD < ON-COMMAND PERIOD │
│                                       →RESET PROHIBITED AND MASKING PROCESS │
└──────────────────────────────────────────────────────────────┘
```

FIG.24

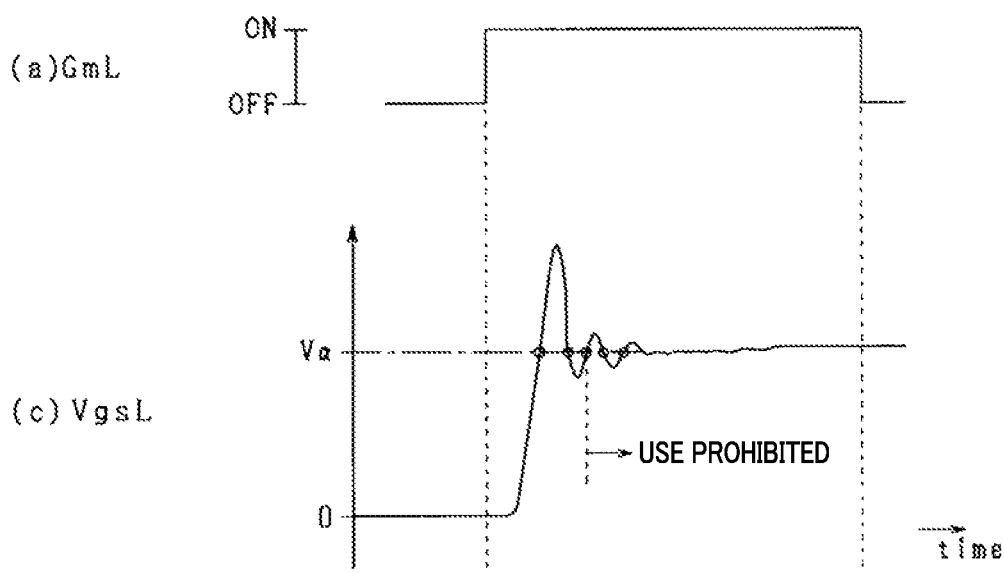

DRIVE CIRCUIT FOR SWITCH

CROSS-REFERENCE TO RELATED APPLICATIONS

The present application is a continuation application of International Application No. PCT/JP2020/022754, filed on Jun. 9, 2020, which claims priority to Japanese Patent Application No. 2019-111155, filed on Jun. 14, 2019. The contents of these applications are incorporated herein by reference in their entirety.

BACKGROUND

Technical Field

The present disclosure relates to a drive circuit for a switch.

Related Art

A drive circuit for a switch that configures a power converter is known. The drive circuit may have a configuration, a so-called active gate, in which a transfer rate of a gate charge of the switch when the driving state of the switch is switched is changed. This configuration can reduce both surge voltage and switching loss that occur when a driving state of a switch is switched.

SUMMARY

One aspect of the present disclosure provides a drive circuit for a switch that drives a switch that configures a power converter. The drive circuit divides an inter-terminal voltage of the switch, and includes a differential circuit that has a first input terminal and a second input terminal to which the inter-terminal voltage that is divided by the voltage divider is inputted, and outputs an analog voltage that is based on a voltage difference between the first input terminal and the second input terminal. The differential circuit executes reset of the output voltage thereof, and with a voltage difference between the first input terminal and the second input terminal when reset is canceled after reset is executed as a reference voltage, outputs an analog voltage in which an amount of change from the reference voltage is multiplied by an amplification factor. The drive circuit outputs a binary signal based on a comparison result between a threshold and the analog voltage that is outputted from the differential circuit, and sets a transfer rate of a gate charge of the switch when a driving state of the switch is switched from either of an off-state and an on-state to the other state, based on the output signal.

BRIEF DESCRIPTION OF THE DRAWINGS

In the accompanying drawings:

FIG. 5 is a flowchart illustrating the steps in an active gate process;

FIG. 6 is a flowchart illustrating the steps in the active gate process;

FIG. 22 is a diagram illustrating a configuration of a detection circuit according to another embodiment;

FIG. 23 is a diagram illustrating processing content of a drive control unit according to another embodiment; and FIG. 24 is a timing chart illustrating processing content of a drive control unit according to another embodiment.

DESCRIPTION OF THE EMBODIMENTS

Figure 1:
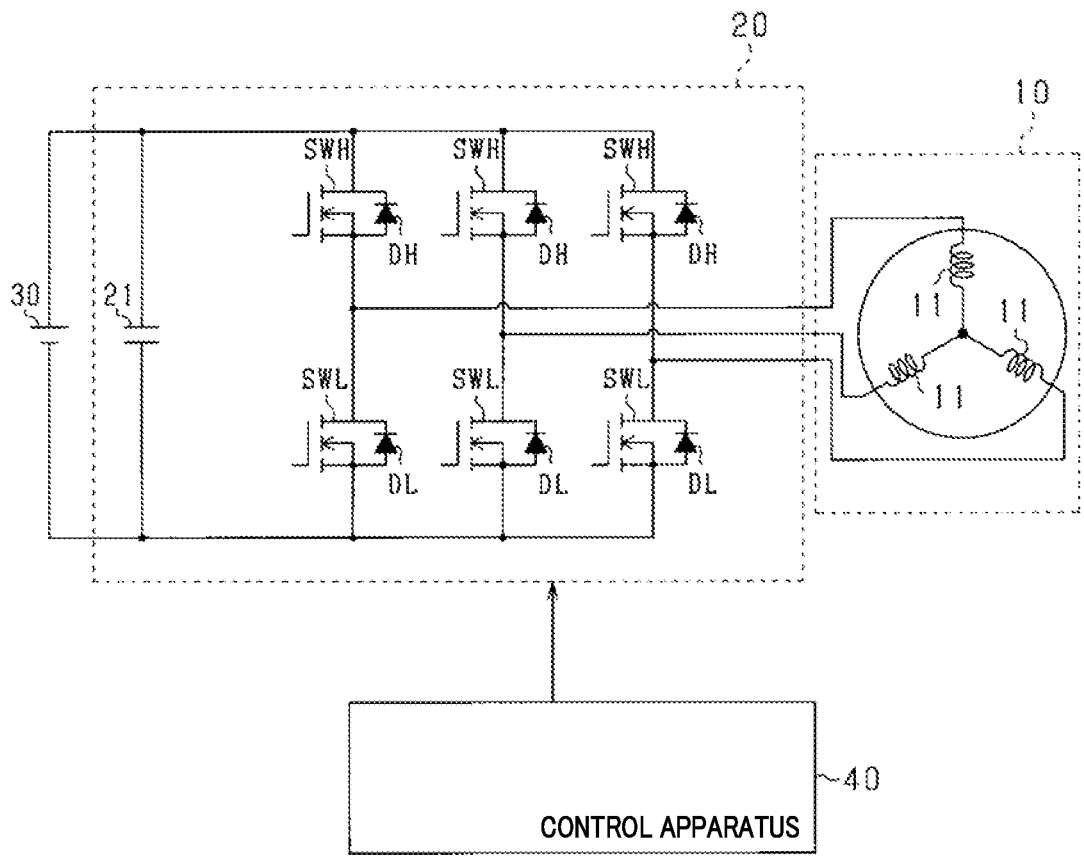
FIG. 1 is an overall configuration diagram illustrating a control system according to a first embodiment.

An exemplary embodiment of the present disclosure relates to a drive circuit for a switch that configures a power converter. For example, as this type of drive circuit, a drive circuit that is described in Japanese Patent Publication No. 4284575 is known. To reduce both surge voltage and switching loss that occur when a driving state of a switch is switched, the drive circuit is provided with a configuration (so-called active gate) in which a transfer rate of a gate charge of the switch when the driving state of the switch is switched is changed.

Here, inter-terminal voltage of the switch is used in implementation of the active gate. This inter-terminal voltage may vary over a range from a value near 0 V to a value near a power supply voltage of a power converter, based on the driving state of the switch. To accommodate this variation, a withstand voltage of a voltage detector that detects the inter-terminal voltage is required to be increased. However, in this case, an insulation distance that is set inside the voltage detector becomes long. Consequently, the voltage detector may increase in size, and further, the drive circuit may increase in size.

It is thus desired to provide a drive circuit for a switch that is capable of being reduced in size.

The exemplary embodiment provides a drive circuit for a switch that drives a switch that configures a power converter. The drive circuit includes: a voltage divider that divides an inter-terminal voltage of the switch; and a differential circuit that has a first input terminal and a second input terminal to which the inter-terminal voltage that is divided by the voltage divider is inputted, and outputs an analog voltage that is based on a voltage difference between the first input terminal and the second input terminal.

The differential circuit provides a function for executing reset of the output voltage thereof, and with a voltage difference between the first input terminal and the second input terminal when reset is canceled after reset is executed as a reference voltage, outputs an analog voltage in which an amount of change from the reference voltage is multiplied by an amplification factor.

The drive circuit includes: a comparator that outputs a binary signal based on a comparison result between a threshold and the analog voltage that is outputted from the differential circuit; and a gate control unit that sets a transfer rate of a gate charge of the switch when a driving state of the switch is switched from either of an off-state and an on-state to the other state, based on the output signal of the comparator.

In the present exemplary embodiment, the binary signal that is based on the comparison result between the analog voltage that is outputted from the differential circuit and the threshold is outputted from the comparator. The transfer rate of the gate charge of the switch when the driving state of the switch is switched is set based on the output signal.

Here, the present exemplary embodiment includes the voltage divider that divides the inter-terminal voltage of the switch. As a result of the voltage divider, an input voltage of the differential circuit can be decreased. In addition, because the differential circuit has the first input terminal and the second input terminal to which the inter-terminal voltage that is divided by the voltage divider is inputted, as a result of the differential circuit, the inter-terminal voltage of the switch can be detected as a value that is based on an electric potential of another end relative to one end of both ends of the switch. Consequently, as a result of the voltage divider and the differential circuit, a withstand voltage of the differential circuit can be reduced and size reduction of the differential circuit can be obtained.

In addition, with the voltage difference between the first input terminal and the second input terminal when reset is canceled as the reference voltage, the differential circuit of the present disclosure outputs the analog voltage in which the amount of change from the reference voltage is multiplied by the amplification factor. As a result of this configuration, an amount of change in the inter-terminal voltage of the switch can be detected as the amount of change from the reference voltage. Consequently, the input voltage of the differential circuit can be decreased, and size reduction of the differential circuit can be obtained.

As a result of the present exemplary embodiment described above, size reduction of the differential circuit can be obtained, and further, size reduction of the drive circuit can be obtained.

First Embodiment

A first embodiment implementing a drive circuit of the present disclosure will hereinafter be described with reference to the drawings.

As shown in FIG. 1, a control system includes a rotating electric machine 10 and an inverter 20. The rotating electric machine 10 is a brushless synchronous motor. According to the present embodiment, the rotating electric machine 10 is a permanent magnet synchronous motor. The rotating electric machine 10 includes windings 11 for three phases. Here, for example, the rotating electric machine 10 may configure a driving apparatus that includes a fan or a pump, and drives the fan or the pump by rotation of a rotor. For example, the fan may be a radiator fan or a fan for air-conditioning inside a vehicle cabin. For example, the pump may be an oil pump or a water pump.

The rotating electric machine 10 is connected to a battery 30 that serves as a direct-current power supply, with the inverter 20 therebetween. The inverter 20 includes a number of series-connection bodies that are composed of upper arm switches SWH and lower arm switches SWL that amounts to a number of phases. For each phase, a first end of the winding 11 is connected to a connection point between the first and lower arm switches SWH and SWL. A second end of the winding 11 of each phase is connected to a neutral point. According to the present embodiment, the windings 11 of the phases that are inductive loads are shifted from each other by an electrical angle of 120°.

According to the present embodiment, voltage-controlled-type semiconductor switching elements are used as the upper and lower arm switches SWH and SWL that configure the inverter 20. More specifically, N-channel metal-oxide-semiconductor field-effect transistors (MOSFETs) are used. Therefore, a high-potential-side terminal of the switch is a drain and a low-potential-side terminal is a source. Upper and lower arm diodes DH and DL are provided in the upper and lower arm switches SWH and SWL as body diodes.

The inverter 20 includes a capacitor 21 that smooths an input voltage of the inverter 20. A high-potential-side terminal of the capacitor 21 is connected to an electrical path that connects a positive electrode terminal of the battery 30 and the drains of the upper arm switches SWH. A low-potential-side terminal of the capacitor 21 is connected to an electrical path that connects a negative electrode terminal of the battery 30 and the sources of the lower arm switches SWL.

The control system includes a control apparatus 40. The control apparatus 40 is mainly configured by a microcomputer. The control apparatus 40 performs switching operation of the switches SWH and SWL in the inverter 20 to perform feedback control of a controlled variable of the rotating electric machine 10 to a command value thereof. According to the present embodiment, the controlled variable is an electrical angular velocity (rotation speed) and the command value thereof is a command angular velocity $\omega^*$.

Figure 2:
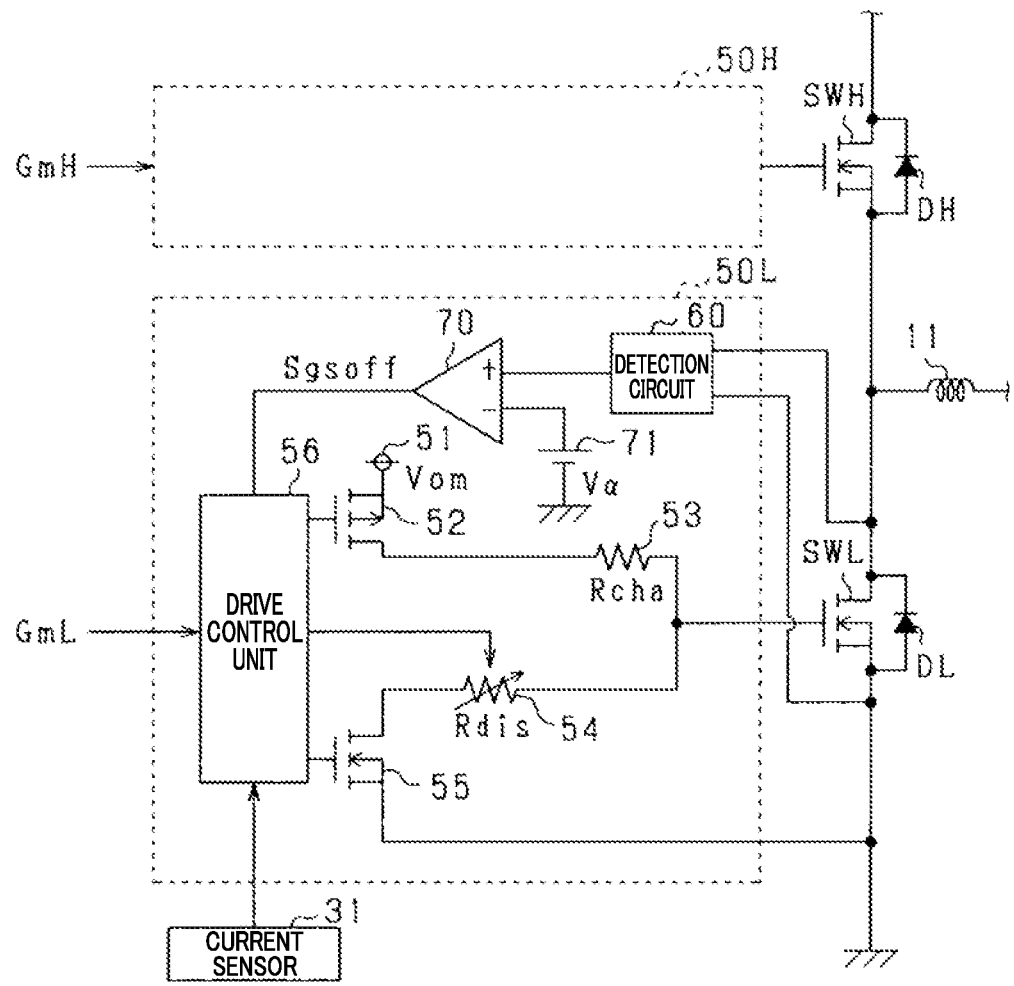
FIG. 2 is a diagram illustrating a configuration of a drive IC.

As shown in FIG. 2, the inverter 20 includes an upper-arm drive integrated circuit (IC) 50H that is individually provided in correspondence to each upper arm switch SWH, and a lower-arm drive IC 50L (corresponding to a drive circuit) that is individually provided in correspondence to each lower arm switch SWL. The control apparatus 40 outputs an upper-arm gate signal GmH to the upper-arm drive IC 50H, and outputs a lower-arm gate signal GmL to the lower-arm drive IC 50L. The gate signals GmH and GmL are either of an on-command for the switch or an off-command for the switch. The upper-arm gate signal GmH and the lower-arm gate signal GmL are alternately set to the on-command such that both are not simultaneously set to an on-state.

Here, for example, functions that are provided by the control apparatus 40 can be provided by software that is recorded in a tangible memory apparatus and a computer that runs the software, hardware, or a combination thereof.

According to the present embodiment, the upper-arm drive IC 50H and the lower-arm drive IC 50L basically have similar configurations. Therefore, the lower-arm drive IC 50L will be described as an example below.

The lower-arm drive IC 50L includes a power supply 51, a charge switch 52, a charge resistor 53, a discharge resistor 54, and a discharge switch 55. According to the present embodiment, the charge switch 52 is a P-channel MOSFET. The discharge switch 55 is an N-channel MOSFET. In FIG. 2, Vom denotes an output voltage of the power supply 51. Rcha denotes a charge resistance value of the charge resistor 53. Rdis denotes a discharge resistance value of the discharge resistor 54.

A first end of the charge resistor 53 is connected to the power supply 51 with the charge switch 52 therebetween. The gate of the lower arm switch SWL is connected to a second end of the charge resistor 53. A first end of the discharge resistor 54 is connected to the gate of the lower arm switch SWL. The source of the lower arm switch SWL is connected to a second end of the discharge resistor 54 with the discharge switch 55 therebetween. The source functions as a ground portion that is a discharge destination of gate charge of the lower arm switch SWL.

Figure 3:
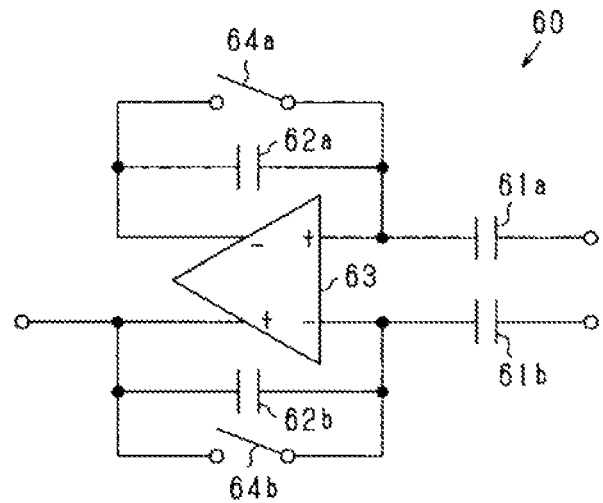
FIG. 3 is a diagram illustrating a configuration of a detection circuit.

The lower-arm drive IC 50L includes a detection circuit 60 (corresponding to a differential circuit), a comparator 70 (corresponding to a discharge-side comparator), and a threshold-generation power supply 71. As shown in FIG. 3, the detection circuit 60 includes a fully-differential amplifier circuit 63, first and second input capacitors 61a and 61b, first and second hold capacitors 62a and 62b, and first and second reset switches 64a and 64b.

A positive-side input terminal (corresponding to a first input terminal) of the fully-differential amplifier circuit 63 and a first end of the first hold capacitor 62a are connected to a first end of the first input capacitor 61a. The drain of the lower arm switch SWL is connected to a second end of the first input capacitor 62a. A negative-side output terminal (corresponding to a first output terminal) of the fully-differential amplifier circuit 63 is connected to a second end of the first hold capacitor 62a. The first reset switch 64A is connected in parallel to the first hold capacitor 62a.

A negative-side input terminal (corresponding to a second input terminal) of the fully-differential amplifier circuit 63 and a first end of the second hold capacitor 62b are connected to a first end of the second input capacitor 61b. The source of the lower arm switch SWL is connected to a second end of the second input capacitor 61b. A positive-side output terminal (corresponding to a second output terminal) of the fully-differential amplifier circuit 63 is connected to a second end of the second hold capacitor 62b. The second reset switch 64 is connected in parallel to the second hold capacitor 62b.

According to the present embodiment, electrostatic capacitances of the first and second input capacitors 61a and 61b are a same value C1. Electrostatic capacitances of the first and second hold capacitors 62a and 62b are a same value C2. In this case, a relationship among a difference (ViH−ViL) between an input voltage ViL at the negative-side input terminal and an input voltage ViH at the positive-side input terminal of the differential amplifier circuit 63, an output voltage Vo at the positive-side output terminal of the differential amplifier circuit 63, and an amplification factor C1/C2 of the differential amplifier circuit 63 is "Vo=C1/C2×(ViH−ViL)". Hereafter, the above-described amplification factor C1/C2 is 1, for convenience.

When the reset switches 64a and 64b are set to an on-state, the output voltage Vo at the positive-side output terminal of the differential amplifier circuit 63 is 0. Hereafter, the reset switches 64a and 64b being set to the on-state is referred to as execution of reset of the detection circuit 60. When reset is executed, the reset switches 64a and 64b are subsequently set to an off-state. Hereafter, the reset switches 64a and 64b being set to the off-state is referred to as cancelation of reset of the detection circuit 60. With (ViH−ViL) (that is, a drain-source voltage of the lower arm switch SWL) at a timing at which reset is canceled as a reference voltage, the detection circuit 60 outputs a value that is obtained by an amount of change from the reference voltage being multiplied by the above-described amplification factor as the output voltage Vo.

Figure 4:
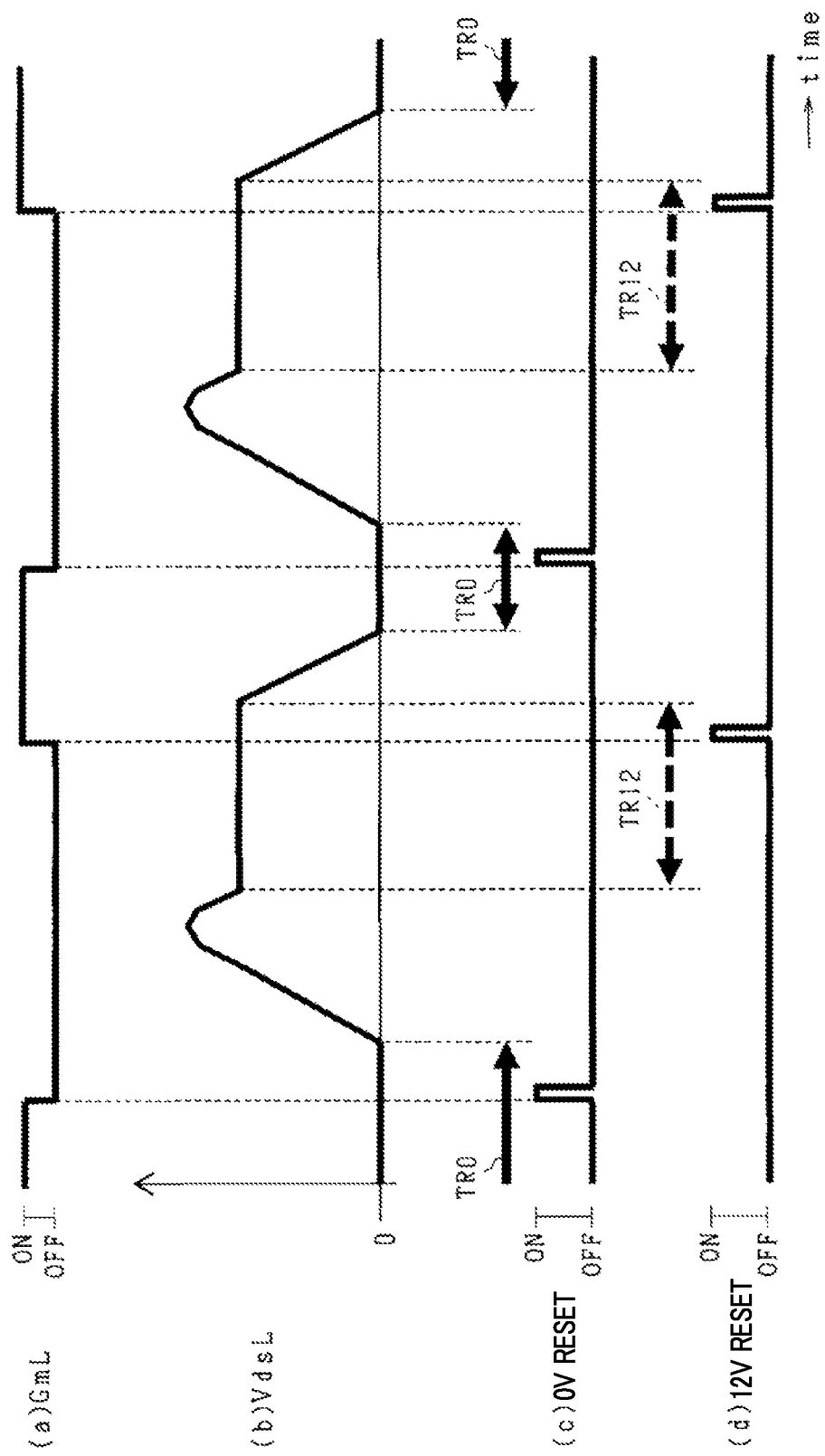
FIG. 4 is a timing chart illustrating an aspect of performing a reset.

Execution and cancelation of reset according to the present embodiment will be further described with reference to FIG. 4. FIG. 4(a) shows transitions in the lower-arm gate signal GmL. FIG. 4(b) shows transitions in a drain-source voltage VdsL of the lower arm switch SWL. FIG. 4(c) shows transitions in the execution and cancelation of reset of the detection circuit 60.

According to the present embodiment, the execution and cancelation of reset are performed during a period TRO in which the lower arm switch SWL is set to the on-state, and surge voltage and ringing converge. In particular, according to the present embodiment, the execution and cancelation of reset are performed at a timing at which the lower-arm gate signal GmL is switched to the off-command. In this case, with 0 V as the reference voltage, the detection circuit 60 outputs the amount of change from the reference voltage.

A non-inverting input terminal of the comparator 70 is connected to the positive-side output terminal of the differential amplifier circuit 63. A positive electrode terminal of the threshold-generation power supply 71 is connected to the inverting input terminal of the comparator 70. The source of the lower arm switch SWL is connected to a negative electrode terminal of the threshold-generation power supply 71.

According to the present embodiment, an output voltage of the threshold-generation power supply 71 is referred to as a discharge-side threshold Vα. The discharge-side threshold Vα is set to a value that is greater than 0 and near an analog voltage that is outputted from the detection circuit 60 when a power supply voltage VDC that is an output voltage of the battery 30 is applied to the lower arm switch SWL. That is, the discharge-side threshold Vα is a value that is near the above-described analog voltage when the lower arm switch SWL is set to the off-state and the upper arm switch SWH is set to the on-state. The discharge-side threshold Vα is set to a value that is slightly lower or a value that is slightly higher than the power supply voltage VDC. According to the present embodiment, the power supply voltage VDC is 12 V, and the discharge-side threshold Vα is set to a value that is slightly lower than 12 V (such as 11 V<Vα<12 V).

A discharge-side signal Sgsoff that is an output signal of the comparator 70 is inputted to a drive control unit 56 that is included in the lower-arm drive IC 50L. The drive control unit 56 acquires the lower-arm gate signal GmL that is outputted from the control apparatus 40. When determined that the acquired lower-arm gate signal GmL is the on-command, the drive control unit 56 sets the charge switch 52 to the on-state and the discharge switch 55 to the off-state. As a result, a charge current is supplied to the gate of the lower arm switch SWL, and the lower arm switch SWL is set to the on-state. Meanwhile, when determined that the acquired lower-arm gate signal GmL is the off-command, the drive control unit 56 sets the charge switch 52 to the off-state and the discharge switch 55 to the on-state. As a result, a discharge current is sent from the gate of the lower arm switch SWL, and the lower arm switch SWL is set to the off-state.

According to the present embodiment, to implement the active gate during off-state, a discharge resistance value Rdis of the discharge resistor 54 is made variable. The discharge resistance value Rdis is changed by the drive control unit 56. Hereafter, an active gate process that is performed by the drive control unit 56 will be described with reference to FIG. 5 and FIG. 6.

First, FIG. 5 will be described.

At step S20, during a current switching cycle Tsw(n), a period Tmir(n) from a start timing of the off-command of the lower-arm gate signal GmL until a logic of the discharge-side signal Sgsoff that is outputted from the comparator 70 is inverted to H is detected. A timing at which the logic of the discharge-side signal Sgsoff is inverted to H is a timing that is equal to an end timing of a Miller period of the lower arm switch SWL. The process at step S20 includes a timing detecting unit.

At step S21, whether the period Tmir(n) that is detected during the current switching cycle Tsw(n) has changed in relation to a period Tmir(n−1) that had been detected in a previous switching cycle Tsw(n−1) is determined. The process at step S21 is performed in light of an appropriate timing at which to change the discharge resistance value Rdis changing as a result of a drain current Id that flows to the lower arm switch SWL and the like changing.

When determined that the period Tmir(n) has changed at step S21, the drive control unit 56 proceeds to step S22 and determines whether the period Tmir(n) that is detected during the current switching cycle Tsw(n) is equal to an initial value Tini thereof. For example, when Δti (>0) is a minimal value, the period Tmir(n) may be determined to be equal to the initial value Tini when "Tini−Δti≤Tmir(n) ≤Tini+Δti" is determined to be satisfied.

When determined that the period Tmir(n) is equal to the initial value Tini at step S22, the drive control unit 56 proceeds to step S23, and sets an increase timing of the discharge resistance value Rdis in a next switching cycle Tsw(n+1) to a timing at which the initial value Tini elapses from the start timing of the off-command of the lower-arm gate signal GmL.

When determined that the period Tmir(n) is not equal to the initial value Tini at step S22, the drive control unit 56 proceeds to step S24, and determines whether the period Tmir(n) that is detected during the current switching cycle Tsw(n) is shorter than the initial value Tini. For example, the period Tmir(n) may be determined to be shorter than the initial value Tini when "Tmir(n)<Tini−Δti" is determined to be satisfied.

When determined that the period Tmir(n) is shorter than the initial value Tini at step S24, the drive control unit 56 proceeds to step S25, and sets the increase timing of the discharge resistance value Rdis in the next switching cycle Tsw(n+1) to be earlier in relation to the timing that is set at step S23, to set a timing at which the period Tmir(n) elapses from the start timing of the off-command of the lower-arm gate signal GmL as the increase timing of the discharge resistance value Rdis.

When determined that the period Tmir(n) is not shorter than the initial value Tini at step S24, the drive control unit 56 determines that the period Tmir(n) that is detected during the current switching cycle Tsw(n) is longer than the initial value Tini and proceeds to step S26. At step S26, the increase timing of the discharge resistance value Rdis in the next switching cycle Tsw(n+1) is set to be later in relation to the timing that is set at step S23, to set the timing at which the period Tmir(n) elapses from the start timing of the off-command of the lower-arm gate signal GmL as the increase timing of the discharge resistance value Rdis.

When determined that the period Tmir(n) has not changed at step S21, the increase timing of the discharge resistance value Rdis in the next switching cycle Tsw(n+1) is a same timing as the increase timing of the discharge resistance value Rdis in the current switching cycle Tsw(n).

Next, FIG. 6 will be described.

At step S30, an off-surge generation period Toffsr that is a period in which the logic of the discharge-side signal Sgsoff is H within the period in which the off-command of the lower-arm gate signal GmL is set is detected.

At step S31, an analog output voltage (hereafter, an off-surge voltage Voffsr) of the detection circuit 60 that corresponds to a surge voltage that is generated when the lower arm switch SWL is switched to the off-state is estimated based on the detected off-surge generation period Toffsr and a detection value of a current (load current) that flows to a switch (such as the lower arm switch SWL). For example, the off-surge voltage Voffsr may be estimated to be higher as the off-surge generation period Toffsr becomes shorter. The process at step S31 correspond to an off-time estimating unit. Here, the load current is detected by a current sensor 31.

For example, the current sensor 31 may be a current sensor, such as a shunt resistor, that is connected to the source side of the lower arm switch SWL, a current sensor that is connected to the drain side of the upper arm switch SWH, or a current sensor that is provided on an electrical path that connects the connection point between the upper and lower arm switches SWH and SWL and the winding 11. A detection value of the current sensor 31 is inputted to the drive control unit 56.

At step S32, whether the off-surge voltage Voffsr that is estimated during the current switching cycle Tsw(n) is equal to a withstand voltage threshold Vlim is determined. The withstand voltage threshold Vlim is an analog voltage that is outputted from the detection circuit 60 when the drain-source voltage of the lower arm switch SWL becomes an allowable upper-limit value thereof. For example, when Δvi (>0) is a minimal value, the off-surge voltage Voffsr may be determined to be equal to the withstand voltage threshold Vlim when "Vlim−Δvi≤Voffsr Vlim+Δvi" is determined to be satisfied.

When determined that the off-surge voltage Voffsr is equal to the withstand voltage threshold Vlim at step S32, the drive control unit 56 proceeds to step S33, and maintains the discharge resistance value Rdis in the next switching cycle Tsw(n+1) at a same value as the discharge resistance value Rdis in the current switching cycle Tsw(n).

When determined that the off-surge voltage Voffsr is not equal to the withstand voltage threshold Vlim at step S32, the drive control unit 56 proceeds to step S34, and determines whether the off-surge voltage Voffsr is less than the withstand voltage threshold Vlim. For example, the off-surge voltage Voffsr may be determined to be less than the withstand voltage threshold Vlim when "Voffsr<Vlim−Δvi" is determined to be satisfied.

When determined that the off-surge voltage Voffsr is less the withstand voltage threshold Vlim at step S34, the drive control unit 56 proceeds to step S35, and sets the discharge resistance value Rdis at and subsequent to the increase timing of the discharge resistance value Rdis in the next switching cycle Tsw(n+1) to be lower than the discharge resistance value Rdis at and subsequent to the increase timing of the discharge resistance value Rdis in the current switching cycle Tsw(n). As a result of the discharge resistance value Rdis being decreased, discharging rate of the gate charge of the lower arm switch SWL becomes higher.

Here, a decrease correction amount (<0) in relation to the discharge resistance value Rdis in the current switching cycle Tsw(n) may be calculated based on a difference between the estimated off-surge voltage Voffsr and the withstand voltage threshold Vlim, and a detection value of a drain current that flows to the lower arm switch SWL. As a result of the calculated decrease correction amount being subtracted from the discharge resistance value Rdis in the current switching cycle Tsw(n), the discharge resistance value Rdis in the next switching cycle Tsw(n+1) is calculated.

When determined that the off-surge voltage Voffsr is not less the withstand voltage threshold Vlim at step S34, the drive control unit 56 determines that the off-surge voltage Voffsr is greater than the withstand voltage threshold Vlim and proceeds to step S36. At step S36, the discharge resistance value Rdis at and subsequent to the increase timing of the discharge resistance value Rdis in the next switching cycle Tsw(n+1) is increased from the discharge resistance value Rdis at and subsequent to the increase timing of the discharge resistance value Rdis in the current switching cycle Tsw(n). As a result of the discharge resistance value Rdis being increased, the discharging rate of the gate charge of the lower arm switch SWL becomes lower.

Here, an increase correction amount (>0) in relation to the discharge resistance value Rdis in the current switching cycle Tsw(n) may be calculated based on the difference between the estimated off-surge voltage Voffsr and the withstand voltage threshold Vlim, and the detection value of the drain current that flows to the lower arm switch SWL. As a result of the calculated increase correction amount being added to the discharge resistance value Rdis in the current switching cycle Tsw(n), the discharge resistance value Rdis in the next switching cycle Tsw(n+1) is calculated.

Figure 7:
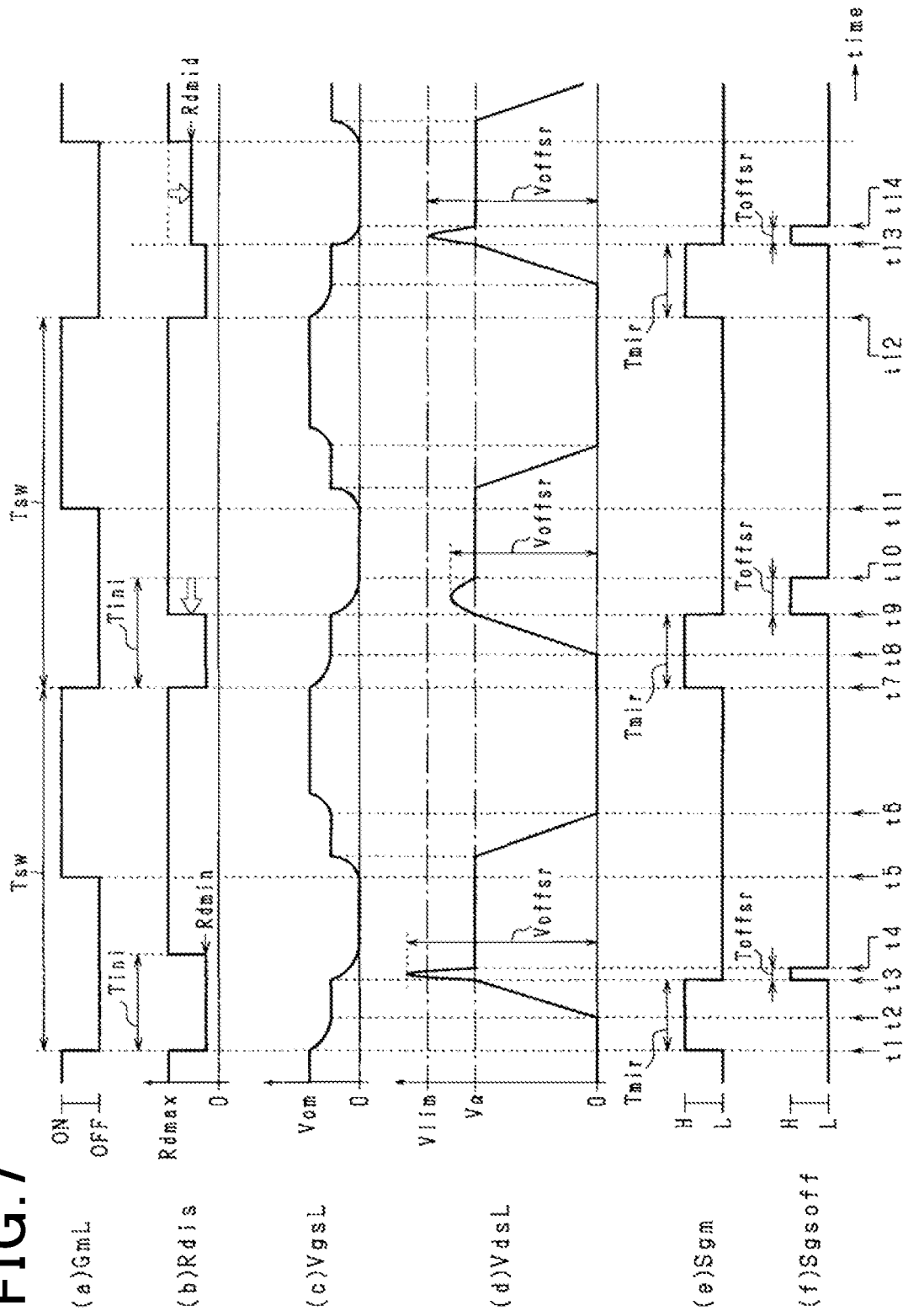
FIG. 7 is a timing chart illustrating an aspect of the active gate process.

An example of the active gate process during off-state will be described with reference to FIG. 7. FIG. 7(a) shows transitions in the lower-arm gate signal GmL. FIG. 7(b) shows transitions in the discharge resistance value Rdis. FIG. 7(c) shows transitions in the gate voltage VgsL of the lower arm switch SWL. FIG. 7(d) shows transitions in the drain-source voltage VdsL of the lower arm switch SWL (analog voltage outputted from the detection circuit 60). FIG. 7(e) shows transitions in a detection flag Sgm for detecting the end timing of the Miller period. FIG. 7(f) shows transitions in the discharge-side signal Sgsoff.

Time t1 is the start timing of the off command of the lower-arm gate signal GmL. At time t1, the discharge resistance value Rdis is decreased from a maximum value Rdmax thereof to a minimum value Rdmin thereof.

The gate voltage VgsL of the lower arm switch SWL starts to decrease. At time t2, the gate voltage VgsL becomes a mirror voltage. In addition, the drain-source voltage VdsL starts to increase.

Subsequently, a period from time t1 to t3 is detected as the period Tmir. Based on a comparison between the detected period Tmir and the initial value Tini, the increase timing of the discharge resistance value Rdis in the next switching cycle Tsw is set. In the example shown in FIG. 7, the increase timing of the discharge resistance value Rdis in the next switching cycle Tsw is made earlier in relation to a timing at which the initial value Tini elapses.

At time t3 to t4, the discharge-side signal Sgsoff becomes logic H. However, in the example shown in FIG. 7, the process in FIG. 6 is not performed during the switching cycle Tsw that starts from time t1.

Subsequently, at the timing at which the initial value Tini elapses from time t1, the discharge resistance value Rdis increases from the minimum value Rdmin thereof to the maximum value Rdmax. Subsequently, at time t5, the lower-arm gate signal GmL is switched to the on-command and the gate voltage VgsL starts to increase. Here, time t6 is the end timing of the Miller period.

At time t7, the lower-arm gate signal GmL is switched to the off-command, and the discharge resistance value Rdis is decreased from the maximum value Rdmax thereof to the minimum value Rdmin. A period from time t7 to t9 is detected as the period Tmir. The period Tmir that is detected in the current switching cycle Tsw is determined to be equal to the period from time t1 to t3 in the previous switching cycle Tsw. At time t9, the discharge resistance value Rdis is increased to the maximum value Rdmax thereof.

From time t9 to t10, the logic of the discharge-side signal Sgsoff is set to H. A period during which this logic H is set is detected as the off-surge generation period Toffsr. Then, the off-surge voltage Voffsr in the current switching cycle Tsw is estimated based on the detected off-surge generation period Toffsr and the load current. The estimated off-surge voltage Voffsr is less than the withstand voltage threshold Vlim. Therefore, the discharge resistance value Rdis in the next switching cycle Tsw is decreased. Here, at time t11, the lower-arm gate signal GmL is switched to the on-command.

Time t12 is the start timing of the off-command of the lower-arm gate signal GmL. At time t12, the discharge resistance value Rdis is decreased from the maximum value Rdmax thereof to the minimum value Rdmin thereof.

A period from time t12 to t13 is detected as the period Tmir. Based on a comparison between the detected period Tmir and the initial value Tini, the increase timing of the discharge resistance value Rdis in the next switching cycle Tsw is set.

At time t13, the discharge resistance value Rdis is increased from the minimum value Rdmin thereof to an intermediate value Rdmid of the minimum value Rdmin and the maximum value Rdmax. In addition, from time t13 to t14, the logic of the discharge-side signal Sgsoff is set to H.

According to the present embodiment described above, the following effects can be obtained.

As a result of the analog voltage that is outputted from the detection circuit 60 and the discharge-side threshold Vα being compared, the discharge-side signal Sgsoff that is based on the comparison result is outputted from the comparator 70. In addition, the end timing of the Miller period is detected based on the discharge-side signal Sgsoff. As a result of this configuration, the analog voltage that is outputted from the detection circuit 60 can be converted to time information without use of an analog-to-digital (AD) converter. Consequently, the configurations of the drive ICs 50H and 50L for implementing the active gate can be simplified, and further, cost of the drive ICs 50H and 50L can be suppressed.

The off-surge generation period Toffsr is detected based on the discharge-side signal Sgsoff, and the off-surge voltage Voffsr is estimated based on the detected off-surge generation period Toffsr. In addition, the discharge resistance value Rdis at and subsequent to the end timing of the Miller period is changed based on the estimated off-surge voltage Voffsr. As a result of this configuration, the discharge resistance value Rdis that is appropriate for achieving an effect of suppressing surge voltage and switching loss can be set by a simple configuration without use of the AD converter.

Variation Example 1 According to the First Embodiment

Only either of the processes shown in FIG. 5 and FIG. 6 may be performed. Here, when only the processes shown in FIG. 6 are performed, for example, the increase timing of the discharge resistance value Rdis may be the timing at which the initial value Tini elapses from the start timing of the off-command of the lower-arm gate signal GmL.

Variation Example 2 According to the First Embodiment

The discharge-side threshold $V\alpha$ that is used for detection of the off-surge generation period Toffsr at step S30 may be a same value as the withstand voltage threshold Vlim.

Second Embodiment

A second embodiment will be described below with reference to the drawings, mainly focusing on differences with the first embodiment. According to the present embodiment, the active gate during off-state is modified. Specifically, the discharge resistance value Rdis during the period in which the logic of the discharge-side signal Sgsoff is set to H, within the period in which the off-command of the lower-arm gate signal GmL is set is greater than the discharge resistance value Rdis during other periods.

Figure 8:
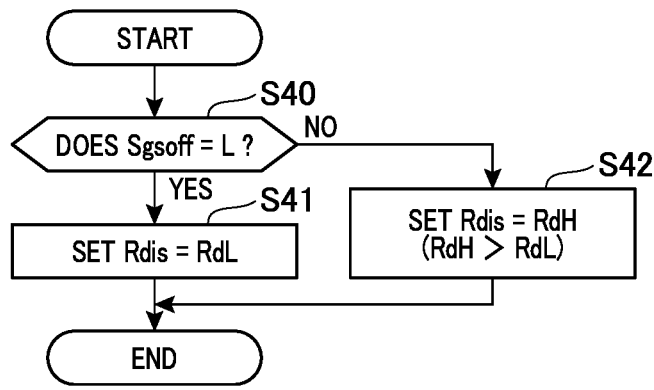
FIG. 8 is a flowchart illustrating the steps in an active gate process according to a second embodiment.

FIG. 8 shows the steps in the active gate process that is performed by the drive control unit 56.

At step S40, whether the logic of the discharge-side signal Sgsoff is L during the period in which the off-command of the lower-arm gate signal GmL is set is determined.

When determined that the logic is L at step S40, the drive control unit 56 proceeds to step S41 and sets the discharge resistance value Rdis to a high-speed-side resistance value RdL. When determined that the logic is H at step S40, the drive control unit 56 proceeds to step S42 and sets the discharge resistance value Rdis to a low-speed-side resistance value RdH that is greater than the high-speed-side resistance value RdL.

Figure 9:
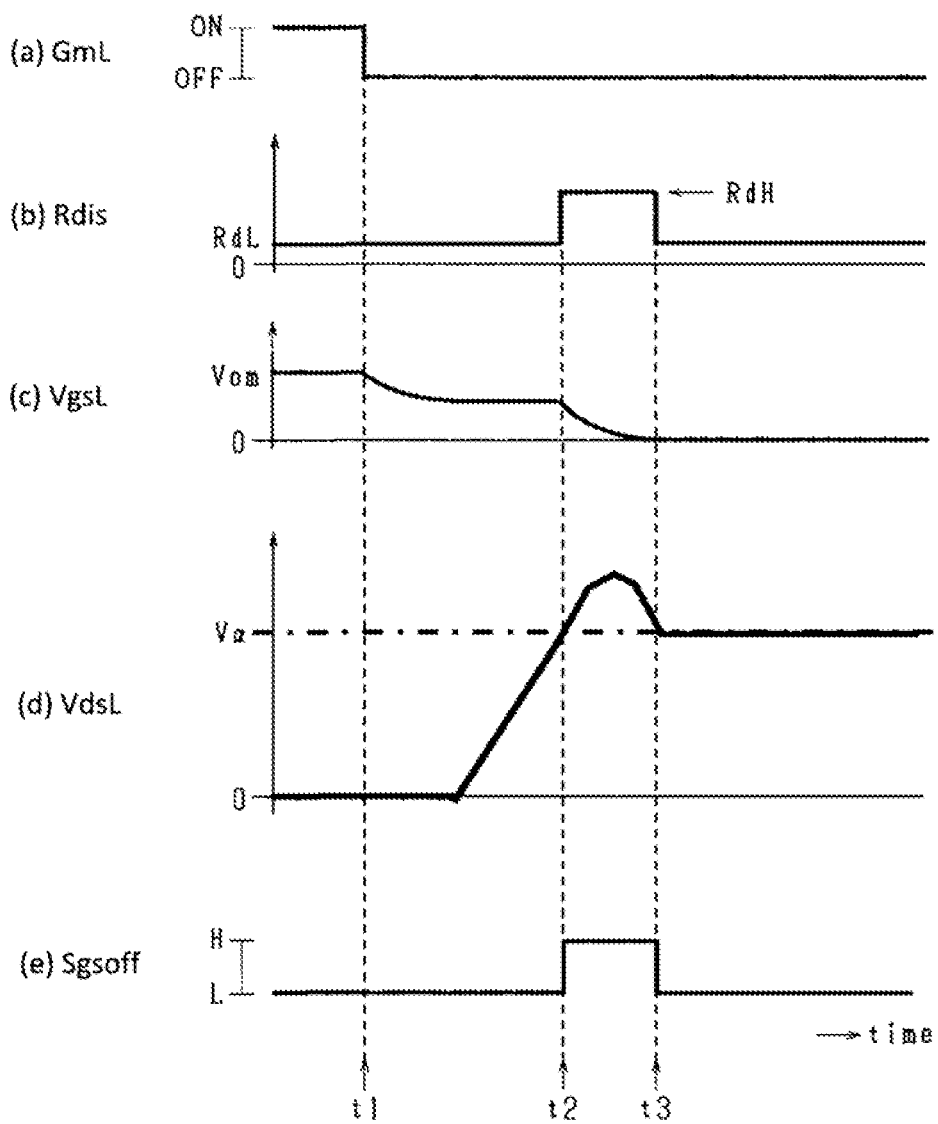
FIG. 9 is a timing chart illustrating an aspect of the active gate process.

An example of the active gate process during off-state will be described with reference to FIG. 9. FIG. 9(a) to FIG. 9(e) correspond to FIGS. 7(a) to (d) and (f) above.

At time t1, the lower-arm gate signal GmL is switched to the off-command. Subsequently, from time t2 to t3, the logic of the discharge-side signal Sgsoff is set to H. Therefore, from time t2 to t3, the discharge resistance value Rdis is set to the low-speed-side resistance value RdH.

According to the present embodiment described above, effects corresponding to the effects according to the first embodiment can be obtained.

Variation Example According to the Second Embodiment

The discharge-side threshold $V\alpha$ may be the same value as the withstand voltage threshold Vlim. In this case, the logic of the discharge-side signal Sgsoff is set to H during a period in which the analog voltage that is outputted from the detection circuit 60 exceeds the withstand voltage threshold Vlim.

Third Embodiment

A third embodiment will be described below with reference to the drawings, mainly focusing on differences with the first embodiment. According to the present embodiment, the active gate during off-state is modified. Specifically, a value of a single discharge-side threshold $V\alpha$ can be switched at every switching cycle Tsw, and the active gate is implemented based on this discharge-side threshold $V\alpha$.

Figure 10:
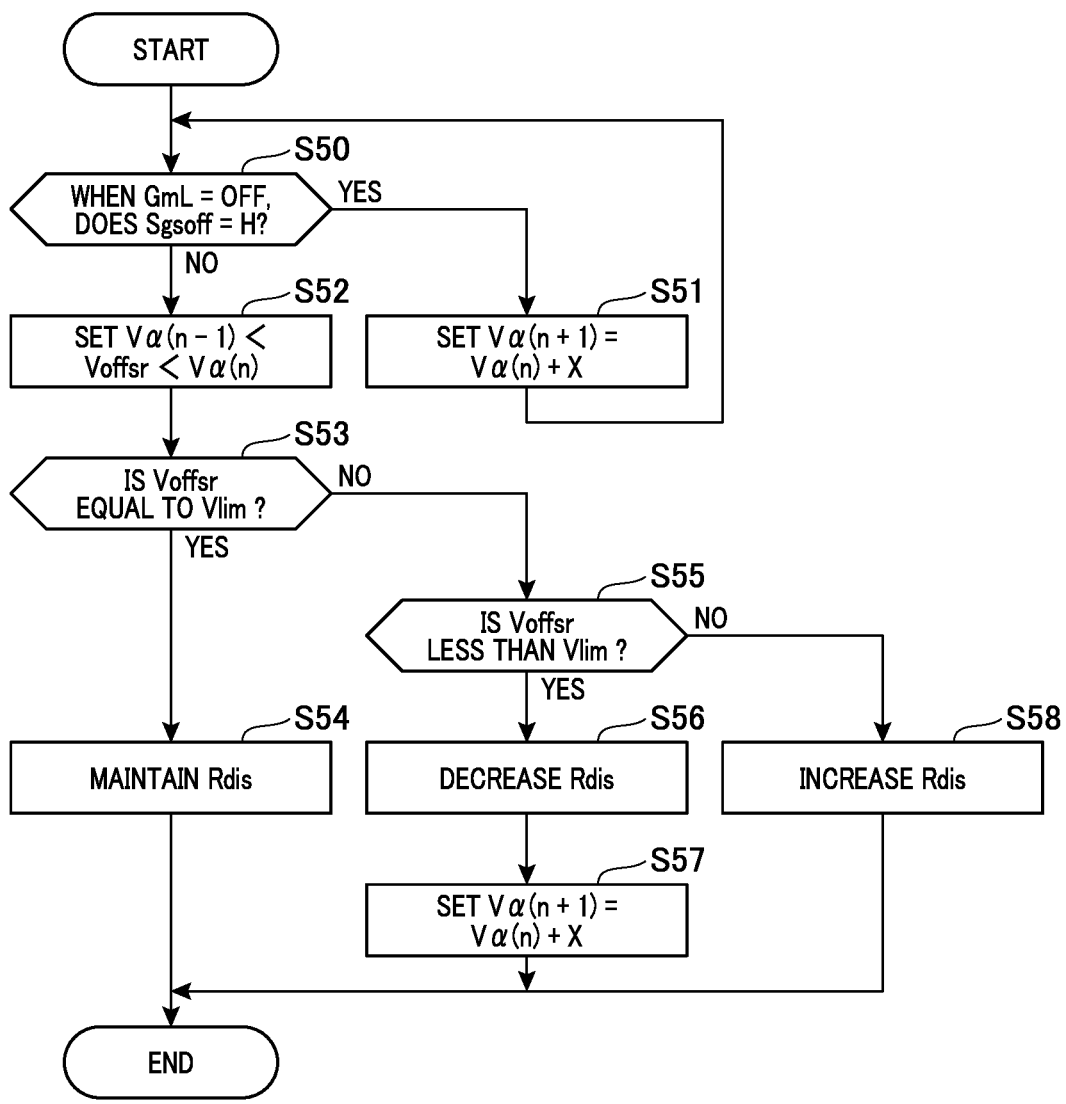
FIG. 10 is a flowchart illustrating the steps in an active gate process according to a third embodiment.

FIG. 10 shows the steps in the active gate process that is performed by the drive control unit 56. Here, according to the present embodiment, an initial value of the discharge-side threshold $V\alpha$ is the value that is described according to the first embodiment. In addition, according to the present embodiment, the drive control unit 56 includes a discharge threshold changing unit.

At step S50, whether the logic of the discharge-side signal Sgsoff is set to H during the period in which the lower-arm gate signal GmL is set to the off-command during the current switching cycle Tsw(n) is determined.

When an affirmative determination is made at step S50, the drive control unit 56 proceeds to step S51 and sets a discharge-side threshold $V\alpha(n+1)$ in the next switching cycle Tsw(n+1) to a value that is obtained by a predetermined value X being added to the discharge-side threshold $V\alpha(n)$ in the current switching cycle Tsw(n). However, an upper limit value of the discharge-side threshold $V\alpha$ is the withstand voltage threshold Vlim. After completion of step S51, the drive control unit 56 proceeds to the process at step S50 in the next switching cycle. Here, the process at step S51 corresponds to the discharge threshold changing unit.

When a negative determination is made at step S50, the drive control unit 56 proceeds to step S52 and estimates the off-surge voltage Voffsr that is generated in the current switching cycle Tsw(n) to be a value that is less than the discharge-side threshold $V\alpha(n)$ in the current switching cycle Tsw(n) and greater than a discharge-side threshold $V\alpha(n-1)$ in the previous switching cycle tsw(n−1). Here, the process at step S52 corresponds to the off-time estimating unit.

At subsequent step S53, whether the off-surge voltage Voffsr that is estimated in the current switching cycle Tsw(n) is equal to the withstand voltage threshold Vlim is determined.

When determined that the off-surge voltage Voffsr is equal to the withstand voltage threshold Vlim at step S53, the drive control unit 56 proceeds to step S54 and maintains the discharge resistance value Rdis at and subsequent to the increase timing of the discharge resistance value Rdis in the next switching cycle Tsw(n+1) at a same value as the discharge resistance value Rdis in the current switching cycle Tsw(n).

When determined that the off-surge voltage Voffsr is not equal to the withstand voltage threshold Vlim at step S53, the drive control unit 56 proceeds to step S55 and determines whether the off-surge voltage Voffsr is less than the withstand voltage threshold Vlim.

When determined that the off-surge voltage Voffsr is less than the withstand voltage threshold Vlim at step S55, the drive control unit 56 proceeds to step S56 and sets the discharge resistance value Rdis at and subsequent to the increase timing of the discharge resistance value Rdis in the next switching cycle Tsw(n+1) to be lower than the discharge resistance value Rdis at and subsequent to the increase timing of the discharge resistance value Rdis in the current switching cycle Tsw(n).

At step S57, the discharge-side threshold $V\alpha(n+1)$ in the next switching cycle Tsw(n+1) is set to a value that is obtained by the predetermined value X being added to the discharge-side threshold $V\alpha(n)$ in the current switching cycle Tsw(n). However, the upper limit value of the discharge-side threshold Vα is the withstand voltage threshold Vlim.

When determined that the off-surge voltage Voffsr is not less than the withstand voltage threshold Vlim at step S55, the drive control unit 56 determines that the off-surge voltage Voffsr is greater than the withstand voltage threshold Vlim and proceeds to step S58. At step S58, the discharge resistance value Rdis at and subsequent to the increase timing of the discharge resistance value Rdis in the next switching cycle Tsw(n+1) is increased from the discharge resistance value Rdis at and subsequent to the increase timing of the discharge resistance value Rdis in the current switching cycle Tsw(n).

According to the present embodiment, as a result of the processes at steps S53 to S58, the discharge resistance value Rdis at and subsequent to the increase timing of the discharge resistance value Rdis is changed such that the off-surge voltage Voffsr becomes the withstand voltage threshold Vlim.

Figure 11:
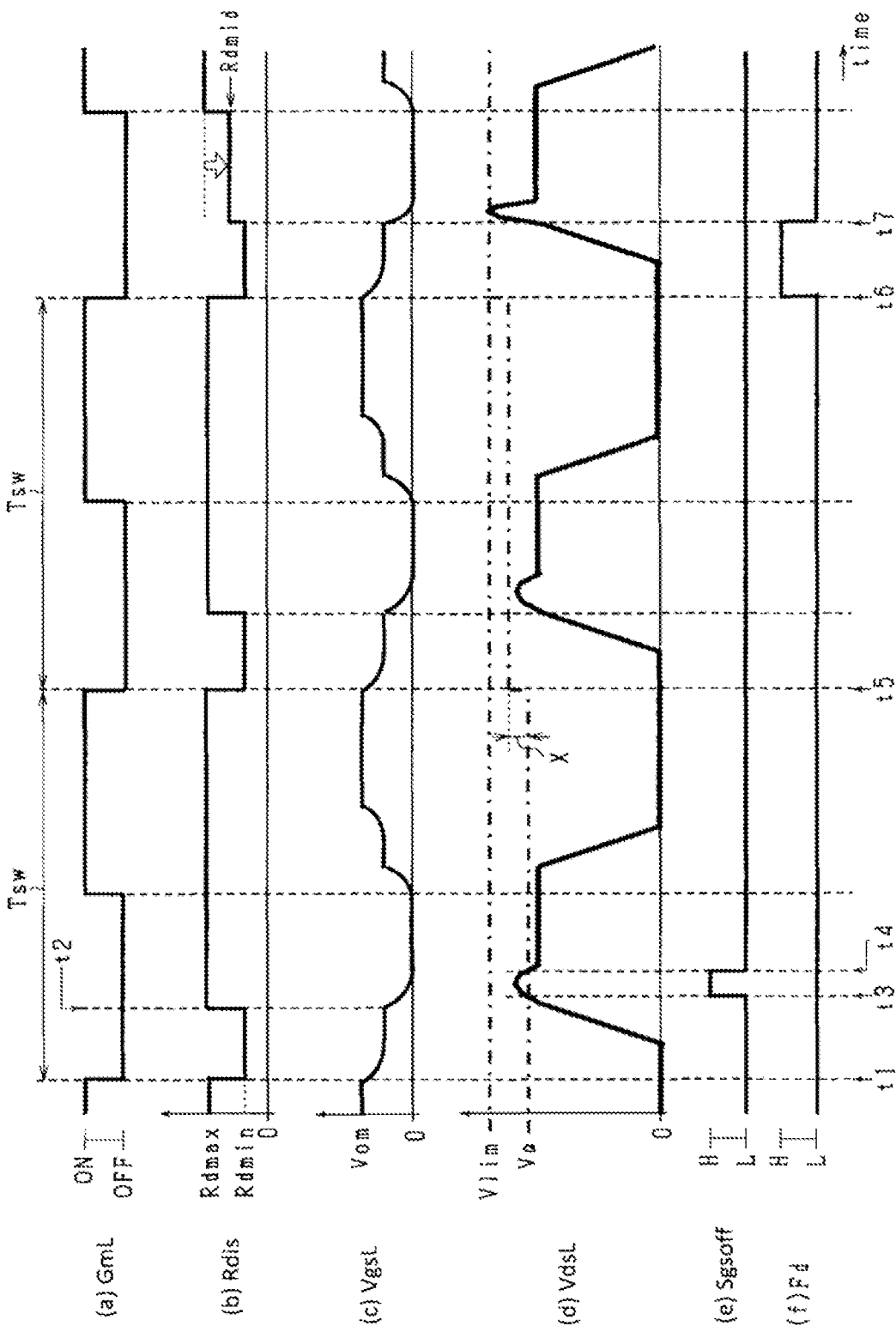
FIG. 11 is a timing chart illustrating an aspect of the active gate process.

An example of the active gate process during off-state will be described with reference to FIG. 11. FIG. 11(*a*) to (*e*) correspond to FIG. 7(*a*) to (*e*) above. FIG. 11(*f*) shows transitions in a flag Fd that is used in changing of the discharge resistance value Rdis.

At time t1, the lower-arm gate signal GmL is switched to the off-command. In this case, the discharge resistance value Rdis is set to the minimum value Rdmin thereof.

Subsequently, at time t2, the discharge resistance value Rdis is increased from the minimum value Rdmin to the maximum value Rdmax. Here, for example, time t2 may be the timing at which the initial value Tini elapses from the start timing (time t1) of the off-command of the lower-arm gate signal GmL. In addition, for example, the period Tmir from time t1 until the logic of the discharge-side signal Sgsoff is inverted to H may be stored when the discharge-side threshold Vα is the initial value thereof, and the timing at which the stored period Tmir elapses from time t1 may be time t2.

Subsequently, from time t3 to t4, the logic of the discharge-side signal Sgsoff is set to H. Therefore, at time t5 in the subsequent switching cycle Tsw, the discharge-side threshold Vα is increased by the predetermined value X. In the switching cycle Tsw from time t5, the logic of the discharge-side signal Sgsoff is not inverted to H. Therefore, a determination result in which the discharge-side signal Sgsoff in the previous switching cycle Tsw is used and a determination result in which the discharge-side signal Sgsoff in the current switching cycle Tsw is used differ. Consequently, the off-surge voltage Voffsr is estimated to be a value that is less than the discharge-side threshold Vα(n) in the current switching cycle Tsw and greater than the discharge-side threshold Vα(n−1) in the previous switching cycle Tsw. In addition, based on the estimated off-surge voltage Voffsr, the discharge resistance value Rdis from time t7 within the switching cycle Tsw at and subsequent to time t6 is decreased from the maximum value Rdmax thereof to the intermediate value Rdmid.

Furthermore, in the switching cycle Tsw from time t5, although the logic of the discharge-side signal Sgsoff is not inverted to H, the discharge-side threshold Vα is less than the withstand voltage threshold Vlim. Therefore, in the example shown in FIG. 11, the discharge-side threshold Vα in the switching cycle Tsw from time t6 is set to the same value as the withstand voltage threshold Vlim as a result of being increased.

According to the present embodiment described above, effects similar to those according to the first embodiment can be obtained.

Variation Example 1 According to the Third Embodiment

Figure 12:
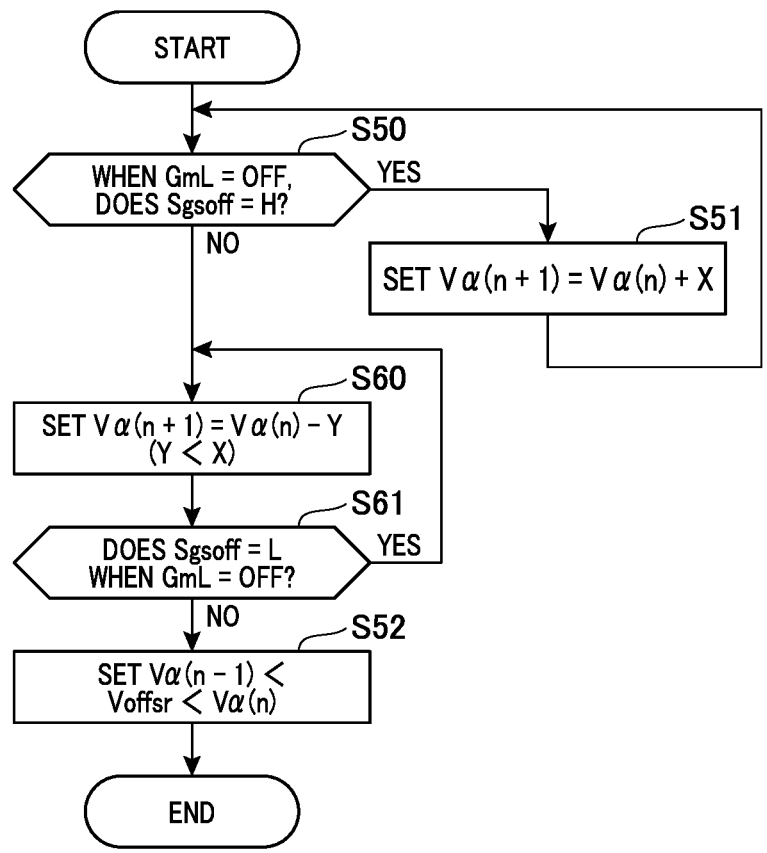
FIG. 12 is a flowchart illustrating the steps in the active gate process in a variation example 1 according to the third embodiment.

An estimation method for the off-surge voltage Voffsr may be modified. Hereafter, this method will be described with reference to FIG. 12. FIG. 12 shows processes related to the estimation of the off-surge voltage Voffsr among the processes shown in FIG. 10 above. Here, in the description with reference to FIG. 12, the predetermined value X is referred to as a first predetermined value X.

When a negative determination is made at step S50, the drive control unit 56 proceeds to step S60 and sets the discharge-side threshold Vα(n+1) in the next switching cycle Tsw(n+1) to a value that is obtained by a second predetermined value Y being subtracted from the discharge-side threshold Vα(n) in the current switching cycle Tsw(n). Here, the second predetermined value Y is a value that is less than the first predetermined value X.

After completion of step S60, the drive control unit 56 proceeds to the process at step S61 in the next switching cycle. At step S61, whether the logic of the discharge-side signal Sgsoff is maintained at L during the period in which the lower-arm gate signal GmL is set to the off-command in the current switching cycle Tsw(n) is determined.

When the affirmative determination is made at step S61, the drive control unit 56 proceeds to step S60. Meanwhile, when a negative determination is made at step S61, the drive control unit 56 proceeds to step S52.

According to the present embodiment described above, the off-surge voltage Voffsr can be quickly estimated.

Variation Example 2 According to the Third Embodiment

The estimation method for the off-surge voltage Voffsr may be modified as described below. This method will be described with reference to FIG. 13 and FIG. 14.

Figure 13:
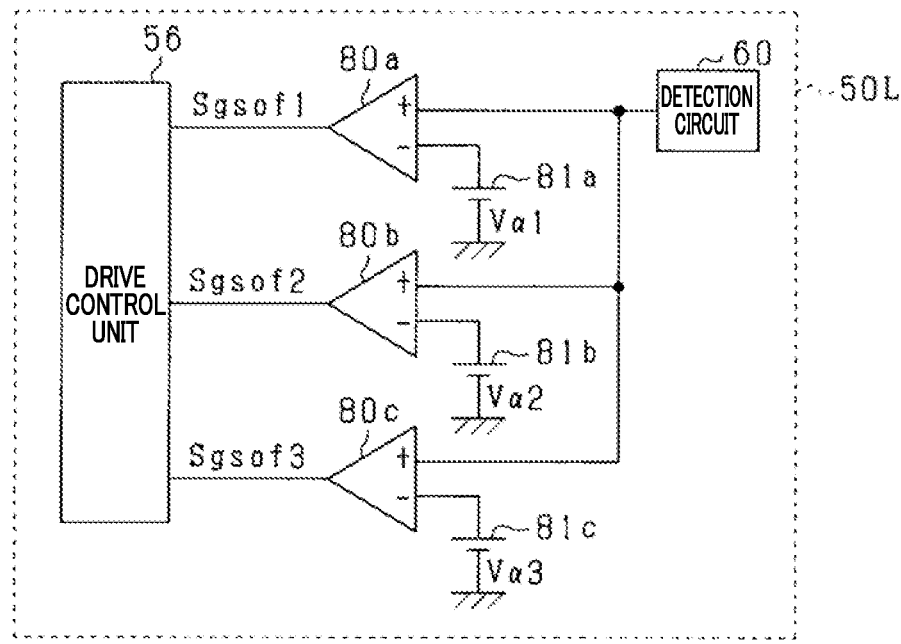
FIG. 13 is a diagram illustrating a configuration of a portion of a drive IC in a variation example 2 according to the third embodiment.

FIG. 13 shows a configuration of a portion of the lower-arm drive IC 50L. The lower-arm drive IC includes a first comparator 80*a*, a second comparator 80*b*, a third comparator 80*c*, a first power supply 81*a*, a second power supply 81*b*, and a third power supply 81*c*. A first discharge-side threshold Vα1 that is an output voltage of the first power supply 81*a* is set to a value near the power supply voltage VDC in a manner similar to the discharge-side threshold Vα described according to the first embodiment.

In addition, the second discharge-side threshold Vα2 that is an output voltage of the second power supply 81*b* is set to a value that is greater than the first discharge-side threshold Vα1. A third discharge-side threshold Vα3 that is an output voltage of the third power supply 81*c* is set to a value that is greater than the second discharge-side threshold Vα2. The first to third discharge-side thresholds Vα1 to Vα3 are set to values that are less than the withstand voltage threshold Vlim.

The analog voltage that is outputted from the detection circuit 60 is inputted to non-inverting input terminals of the comparators 80*a* to 80*c*. The first to third discharge-side thresholds Vα1 to Vα3 are inputted from the power supplies 81*a* to 81*c* to inverting input terminals of the comparators 80*a* to 80*c*.

A first discharge-side signal Sgsof1 that is an output signal of the first comparator 80*a*, a second discharge-side signal Sgsof2 that is an output signal of the second comparator 80b, and a third discharge-side signal Sgsof3 that is an output signal of the third comparator 80c are inputted to the drive control unit 56.

Figure 14:
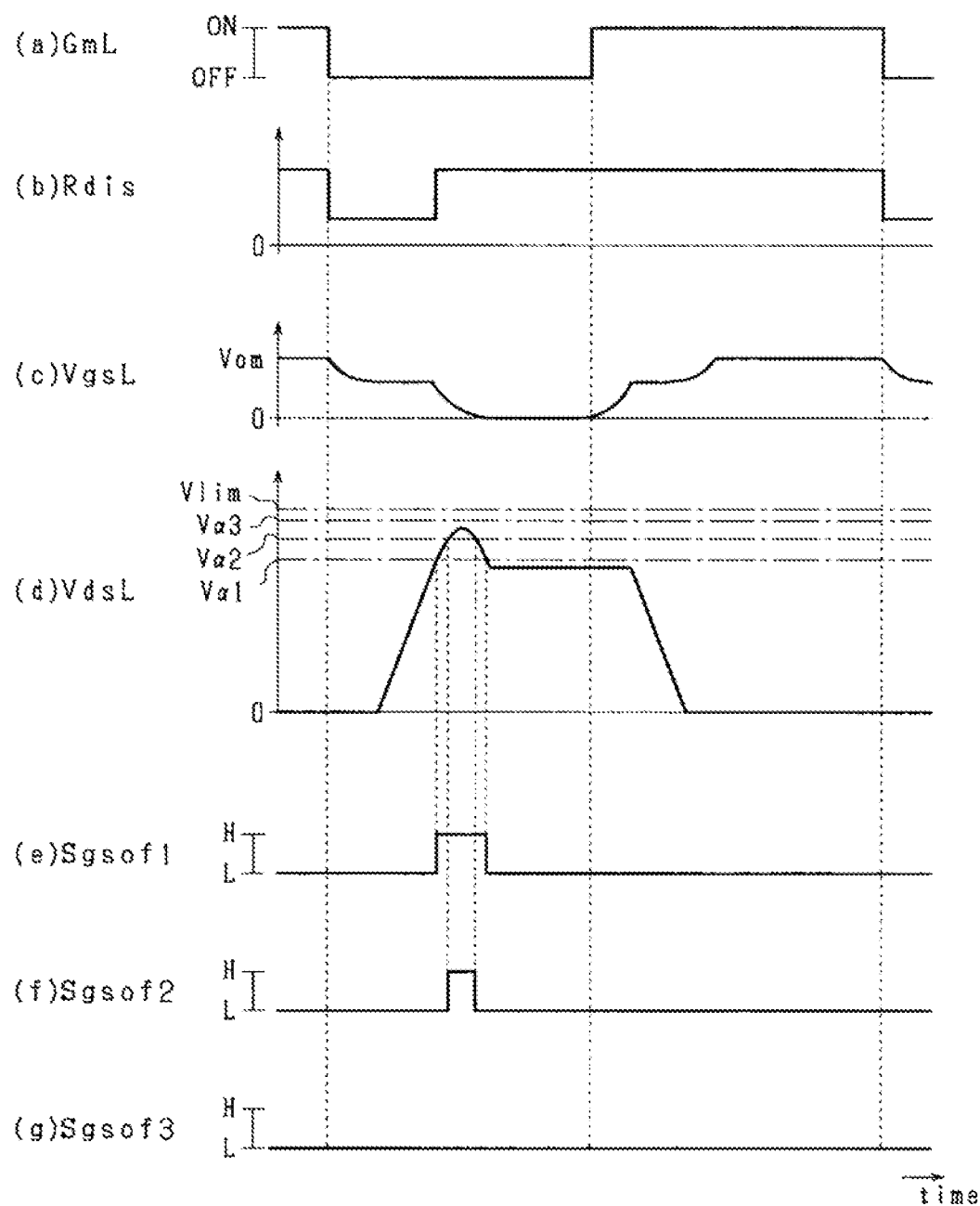
FIG. 14 is a timing chart illustrating an aspect of estimation of a surge voltage.

The estimation method for the off-surge voltage Voffsr will be described with reference to FIG. 14. FIG. 14(a) to (d) correspond to FIG. 7(a) to (d) above. FIG. 14(e) to (g) show transitions in the first to third discharge-side signals Sgsof1 to Sgsof3.

During the period in which the lower-arm gate signal GmL is set to the off-command, among the discharge-side signals Sgsof1 to Sgsof3, only the first and second discharge-side signals Sgsof1 and Sgsof2 are inverted to logic H. Therefore, the drive control unit 56 estimates the off-surge voltage Voffsr to be an intermediate value between the second discharge-side threshold Vα2 and the third discharge-side threshold Vα3.

Fourth Embodiment

Figure 15:
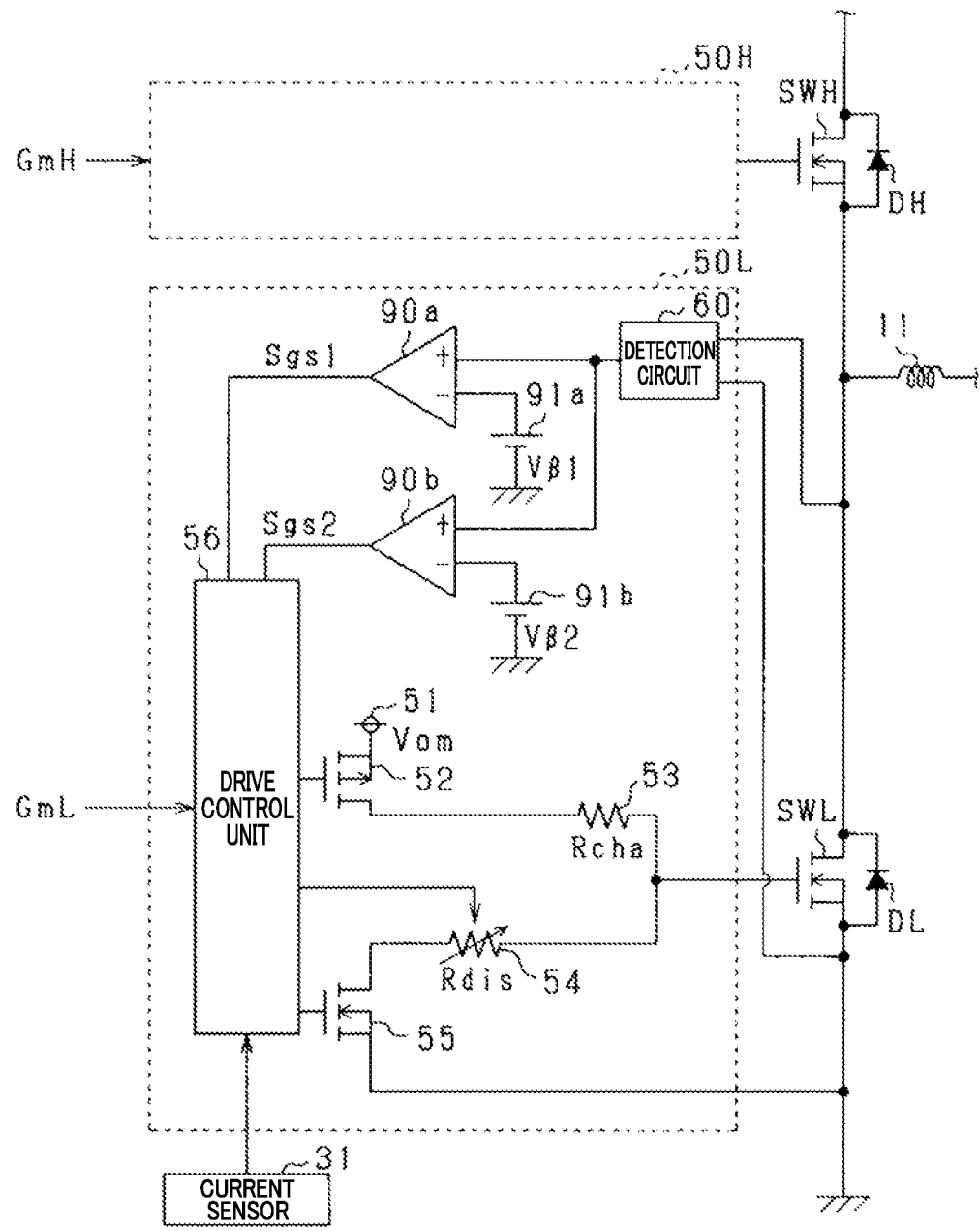
FIG. 15 is a diagram illustrating a configuration of a drive IC according to a fourth embodiment.

A fourth embodiment will be described below with reference to the drawings, mainly focusing on differences with the first embodiment. According to the present embodiment, the active gate during off-state is modified. Therefore, as shown in FIG. 15, the configuration of the drive IC is modified. In FIG. 15, configurations that are identical to those shown in FIG. 2 above are given the same reference numbers for convenience.

The lower-arm drive IC 50L includes a first comparator 90a (corresponding to a first discharge-side comparator), a second comparator 90b (corresponding to a second discharge-side comparator), a first power supply 91a, and a second power supply 91b. A first discharge-side threshold Vβ1 that is an output voltage of the first power supply 91a is set to a value that is slightly greater than 0 (such as 0 V<Vβ1<1 V). A second discharge-side threshold Vβ2 that is an output voltage of the second power supply 91b is set to a value near the power supply voltage VDC in a manner similar to the discharge-side threshold Vα described according to the first embodiment.

The analog voltage that is outputted from the detection circuit 60 is inputted to non-inverting input terminals of the comparators 90a and 90b. The discharge-side thresholds Vβ1 and Vβ2 are inputted from the power supplies 91a and 91b to inverting input terminals of the comparators 90a and 90b.

A first discharge-side signal Sgs1 that is an output signal of the first comparator 90a and a second discharge-side signal Sgs2 that is an output signal of the second comparator 90b are inputted to the drive control unit 56.

Figure 16:
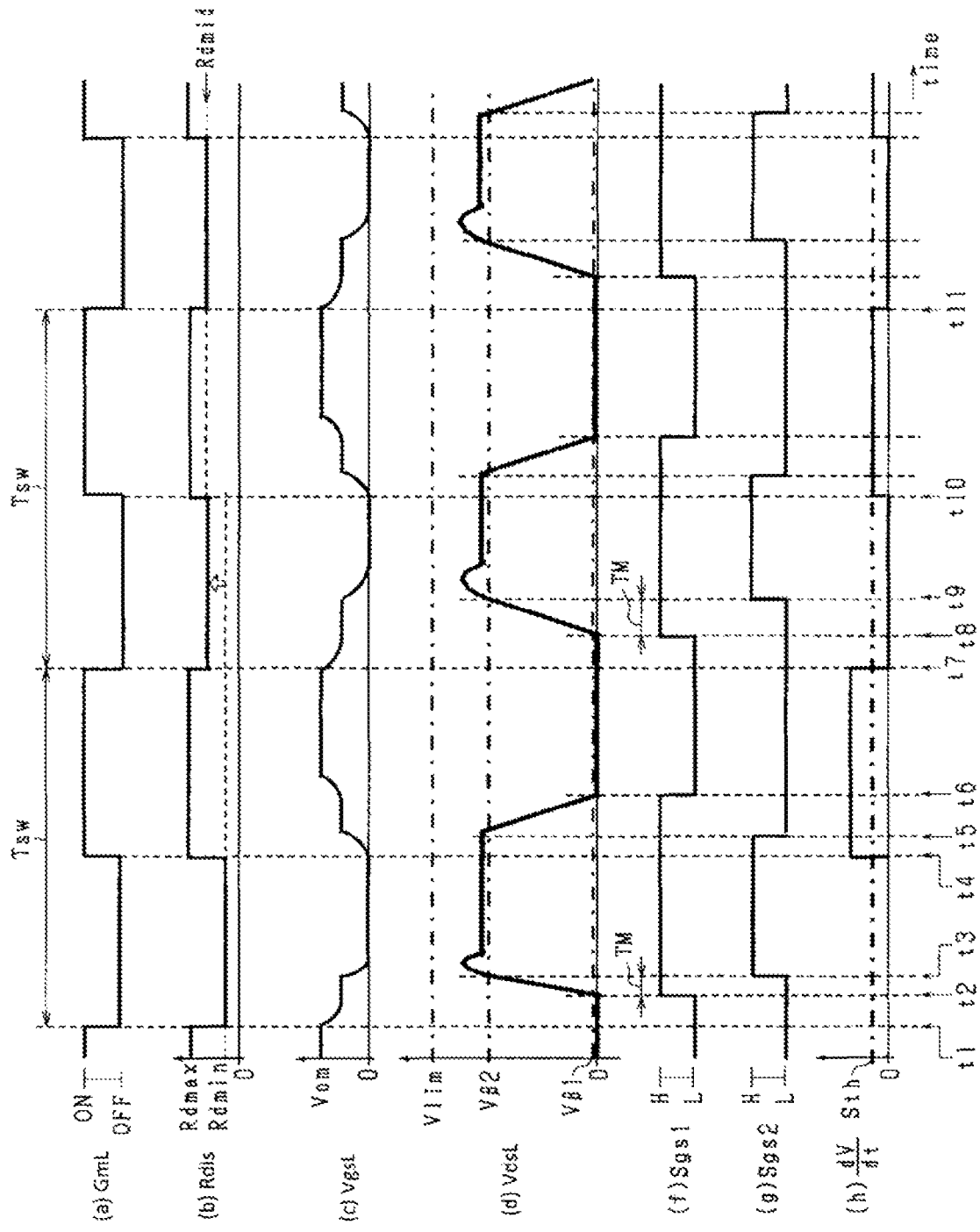
FIG. 16 is a timing chart illustrating an aspect of an active gate process.

The active gate process performed by the drive control unit 56 will be described with reference to FIG. 16. FIG. 16(a) to (d) correspond to FIG. 7(a) to (d) above. FIGS. 16(e) and (f) show transitions in the first and second discharge-side signals Sgs1 and Sgs2. FIG. 16(g) shows an increase speed dV/dt of the drain-source voltage VdsL when the lower arm switch SWL is switched to the off-state. According to the present embodiment, the drive control unit 56 includes an off-time speed calculating unit.

At time t1, the lower-arm gate signal GmL is switched to the off-command. Therefore, at time t2, the logic of the first discharge-side signal Sgs1 is inverted to H. At time t3, the logic of the second discharge-side signal Sgs2 is inverted to H. A timing at which the logic of the first discharge-side signal Sgs1 is inverted to H can be determined to be a timing that is equal to the start timing of the Miller period. A timing at which the logic of the second discharge-side signal Sgs2 is inverted to H can be determined to be a timing that is equal to the end timing of the Miller period.

The drive control unit 56 calculates the increase speed dV/dt as in expression (eq1) below, based on a period TM from time t2 to t3 and a difference between the first discharge-side threshold Vβ1 and the second discharge-side threshold Vβ2.

$$dV/dt=(V\beta2-V\beta1)/TM \quad (eq1)$$

Subsequently, at time t4 at which the lower-arm gate signal GmL is switched to the on-command, the drive control unit 56 determines that the calculated increase speed dV/dT is greater than a speed threshold Sth thereof. Therefore, the drive control unit 56 increases the discharge resistance value Rdis in the next switching cycle Tsw from time t7.

At time t5, the logic of the second discharge-side signal Sgs2 is inverted to L. At time t6, the logic of the first discharge-side signal Sgs1 is inverted to L.

At time t7, the lower-arm gate signal GmL is switched to the off-command. Therefore, at time t8, the logic of the first discharge-side signal Sgs1 is inverted to H. At time t9, the logic of the second discharge-side signal Sgs2 is inverted to H. The drive control unit 56 calculates the increase speed dV/dt based on the period TM from time t8 to t9, and the difference between the first discharge-side threshold Vβ1 and the second discharge-side threshold Vβ2.

At time t10 when the lower-arm gate signal GmL is switched to the on-command, the drive control unit 56 determines that the calculated increase speed dV/dt is equal to the speed threshold Sth. Therefore, the drive control unit 56 maintains the discharge resistance value Rdis in the next switching cycle Tsw from time t11 at the discharge resistance value Rdis in the current switching cycle Tsw.

According to the present embodiment described above, the increase speed dV/dt during the Miller period becoming excessively high can be suppressed. As a result, noise that is generated in accompaniment with switching of the lower arm switch SWL to the off-state can be reduced. Decrease in electromagnetic compatibility (EMC) characteristics can be suppressed.

Variation Example According to the Fourth Embodiment

Instead of the configuration in which the discharge resistance value Rdis during all periods in which the lower-arm gate signal GmL is set to the off-command is changed, the configuration may be such that the discharge resistance value Rdis at and subsequent to the start timing of the Miller period, among the periods in which the lower-arm gate signal GmL is set to the off-command, is changed. In addition, the configuration may be such that the discharge resistance value Rdis is changed only during the Miller period among the periods in which the lower-arm gate signal GmL is set to the off-command.

Fifth Embodiment

A fifth embodiment will be described below with reference to the drawings, mainly focusing on differences with the first embodiment. According to the present embodiment, the active gate process when the lower arm switch SWL (corresponding to an own arm switch) is switched to the on-state is performed.

Figure 17:
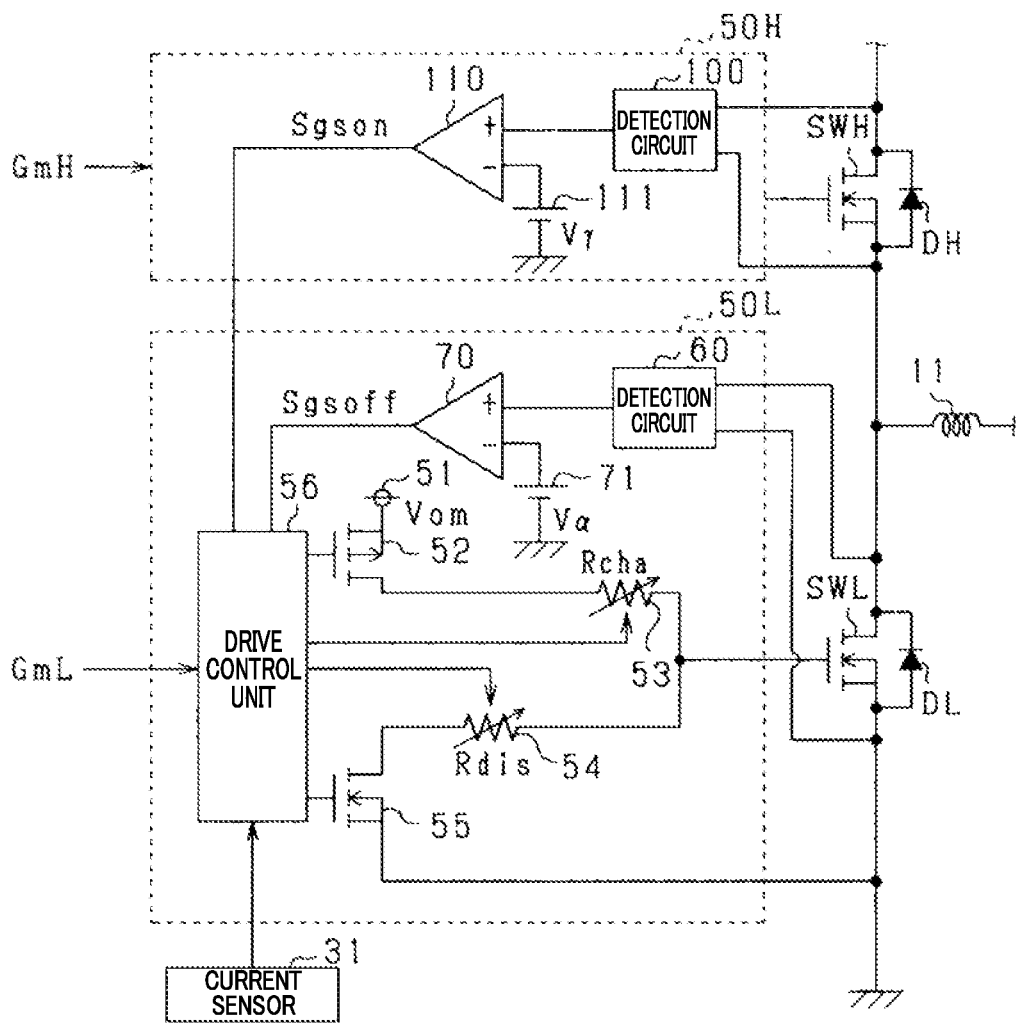
FIG. 17 is a diagram illustrating a configuration of a drive IC according to a fifth embodiment.

FIG. 17 shows the configurations of the drive ICs. In FIG. 17, configurations that are identical to the configurations shown in FIG. 2 above are given the same reference numbers for convenience.

The upper-arm drive IC 50H includes a detection circuit 100 (corresponding to a differential circuit), a comparator 110 (corresponding to a charge-side comparator), and a threshold-generation power supply 111. The detection circuit 100 has a configuration that is similar to that of the detection circuit 60 on the lower arm side. Therefore, a detailed description of the detection circuit 100 is omitted.

According to the present embodiment, execution of reset and cancelation of reset are performed during a period in which the upper arm switch SWH that serves as an opposing arm switch is set to the on-state, and surge voltage and ringing of a drain-source voltage VdsH of the upper arm switch SWH are converged.

A positive electrode terminal of the threshold-generation power supply 111 is connected to an inverting input terminal of the comparator 110. A source of the upper arm switch SWH is connected to a negative electrode terminal of the threshold-generation power supply 111. According to the present embodiment, an output voltage of the threshold-generation power supply 111 is referred to as a charge-side threshold $V\gamma$. The charge-side threshold $V\gamma$ is set to a value that is greater than 0 and near the analog voltage that is outputted from the detection circuit 60 when the power supply voltage VDC that is the output voltage of the battery 30 is applied to the lower arm switch SWL. According to the present embodiment, the charge-side threshold $V\gamma$ is set to a same value as the discharge-side threshold $V\alpha$.

Figure 18:
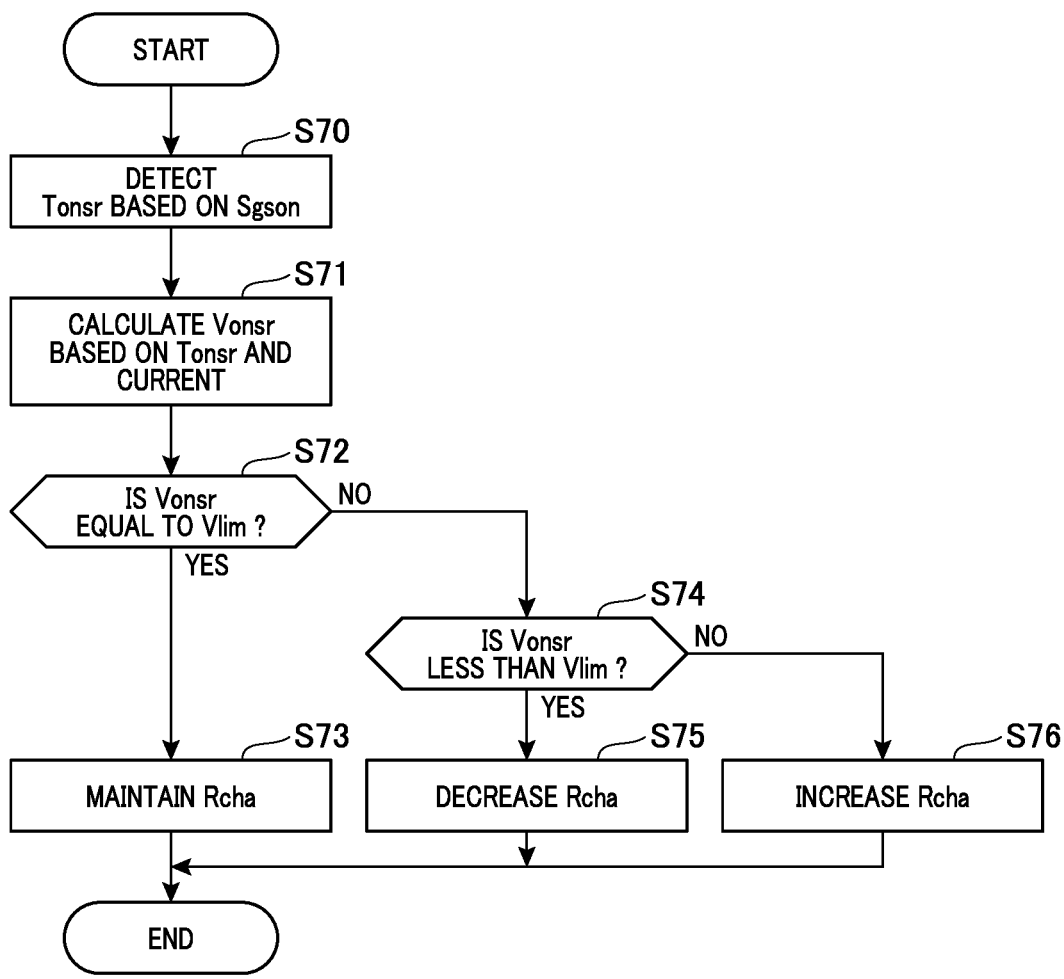
FIG. 18 is a flowchart illustrating the steps in an active gate process.

A charge-side signal Sgson that is an output signal of the comparator 110 is inputted to the drive control unit 56 that is provided in the lower-arm drive IC 50L. According to the present embodiment, to implement the active gate during the on-state, a charge resistance value Rcha of the charge resistor 53 is made variable. The charge resistance value Rcha is changed by the drive control unit 56. Hereafter, the active gate process performed by the drive control unit 56 will be described with reference to FIG. 18.

At step S70, an on-surge generation period Tonsr that is a period during which the logic of the charge-side signal Sgson is set to H within a period in which the on-command of the lower-arm gate signal GmL is set is detected.

At step S71, an analog output voltage (hereafter, an on surge voltage Vonsr) of the detection circuit 100 that corresponds to a surge voltage that is generated when the lower arm switch SWL is switched to the on-state is estimated based on the detected on-surge generation period Tonsr and the detection value of the load current. The surge voltage is generated as a result of recovery of the upper arm diode DH. For example, at step S71, the on-surge voltage Vonsr may be estimated to be higher as the on-surge generation period Tonsr becomes shorter. The process at step S71 corresponds to an on-time estimating unit.

At step S72, whether the on-surge voltage Vonsr that is estimated during the current switching cycle Tsw(n) is equal to the withstand voltage threshold Vlim is determined.

When determined that the on-surge voltage Vonsr is equal to the withstand voltage threshold Vlim at step S72, the drive control unit 56 proceeds to step S73, and maintains the charge resistance value Rcha during the period in which the on-command of the lower-arm gate signal GmL is set in the next switching cycle Tsw(n+1) at a same value as the charge resistance value Rcha in the current switching cycle Tsw(n).

When determined that the on-surge voltage Vonsr is not equal to the withstand voltage threshold Vlim at step S72, the drive control unit 56 proceeds to step S74, and determines whether the on-surge voltage Vonsr is less than the withstand voltage threshold Vlim.

When determined that the on-surge voltage Vonsr is less than the withstand voltage threshold Vlim at step S74, the drive control unit 56 proceeds to step S75, and sets the charge resistance value Rcha during the period in which the on-command of the lower-arm gate signal GmL is set in the next switching cycle Tsw(n+1) to be lower than the charge resistance value Rcha in the current switching cycle Tsw(n). As a result of the charge resistance value Rcha being decreased, charging rate of the gate charge of the lower arm switch SWL becomes higher.

When determined that the on-surge voltage Vonsr is not less than the withstand voltage threshold Vlim at step S74, the drive control unit 56 determines that the on-surge voltage Vonsr is greater than the withstand voltage threshold Vlim and proceeds to step S76. At step S76, the charge resistance value during the period in which the on-command of the lower-arm gate signal GmL is set in the next switching cycle Tsw(n+1) is increased from the charge resistance value Rcha in the current switching cycle Tsw(n). As a result of the charge resistance value Rcha being increased, the charging rate of the gate charge of the lower arm switch SWL becomes lower.

According to the present embodiment described above, effects similar to those according to the first embodiment can be obtained even when the lower arm switch SWL is switched to the on-state.

Here, in a manner similar to that of the lower arm switch SWL, the active gate can be applied even when the upper arm switch SWH is switched to the on-state.

Variation Example According to Fifth Embodiment

The charge-side threshold $V\gamma$ that is used for detection of the on-surge generation period Tonsr at step S70 may be a same value as the withstand voltage threshold Vlim.

Sixth Embodiment

A sixth embodiment will be described below with reference to the drawings, mainly focusing on differences with the first embodiment. According to the present embodiment, the active gate during on is changed. Specifically, switching of the value of a single charge-side threshold can be switched every switching cycle, and the active gate is performed based on the charge-side threshold.

Figure 19:
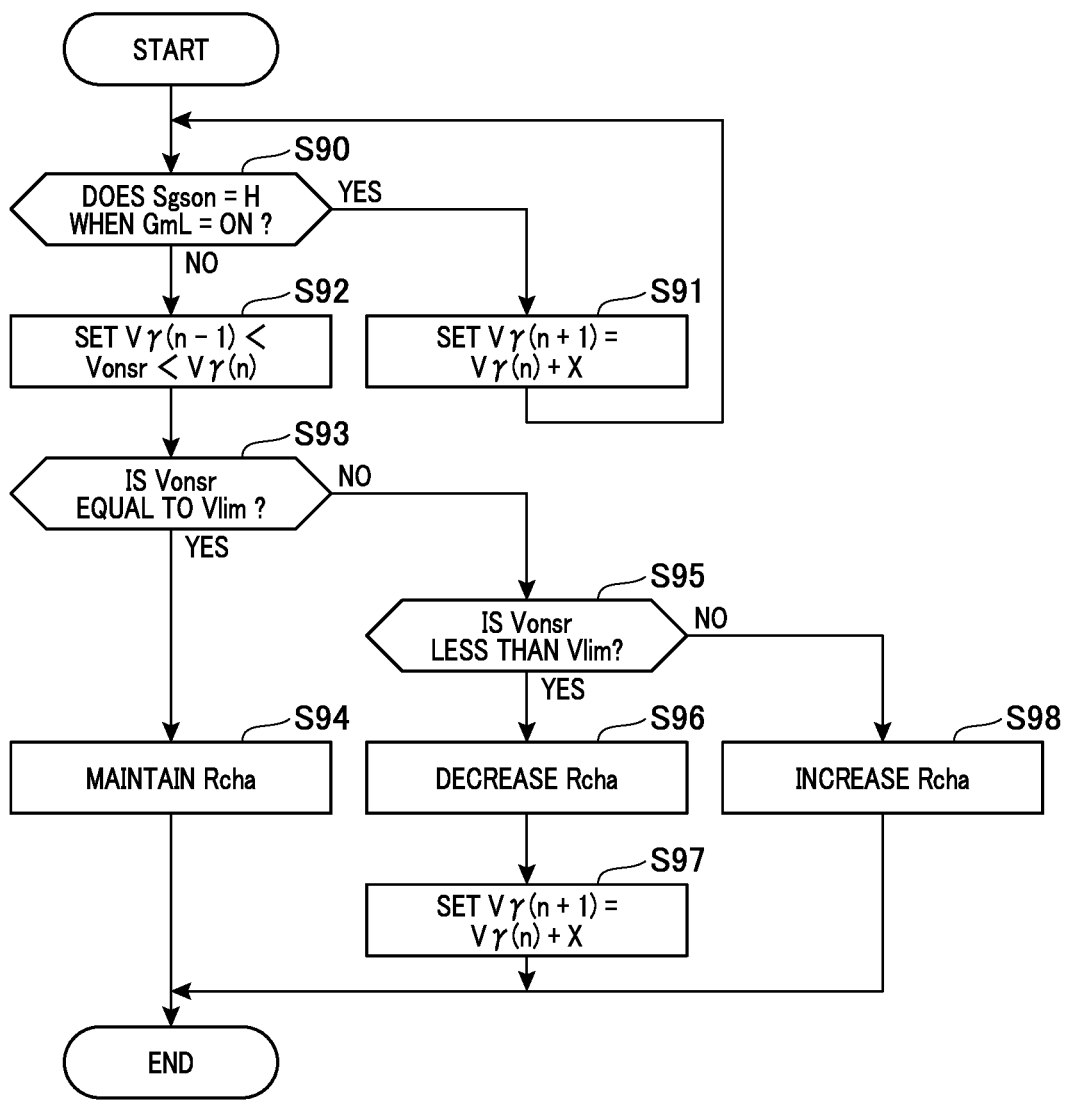
FIG. 19 is a flowchart illustrating the steps in an active gate process according to a sixth embodiment.

FIG. 19 shows the steps in the active gate process that is performed by the drive control unit 56. Here, according to the present embodiment, an initial value of the charge-side threshold $V\gamma$ is a same value as the discharge-side threshold $V\alpha$ described according to the first embodiment. In addition, according to the present embodiment, the drive control unit 56 includes a charge threshold changing unit.

At step S90, whether the logic of the charge-side signal Sgson is set to H during the period in which the lower-arm gate signal GmL is set to the on-command during the current switching cycle Tsw(n) is determined.

When an affirmative determination is made at step S90, the drive control unit 56 proceeds to step S91 and sets a charge-side threshold $V\gamma(n+1)$ in the next switching cycle Tsw(n+1) to a value that is obtained by the predetermined value X being added to the charge-side threshold $V\gamma(n)$ in the current switching cycle Tsw(n). However, an upper limit value of the charge-side threshold $V\gamma$ is the withstand voltage threshold Vlim. After completion of step S91, the drive control unit 56 proceeds to the process at step S90 in the next switching cycle. Here, the process at step S91 corresponds to the charge threshold changing unit.

When a negative determination is made at step S90, the drive control unit 56 proceeds to step S92 and estimates the on-surge voltage Vonsr that is generated in the current switching cycle Tsw(n) to be a value that is less than the charge-side threshold Vγ(n) in the current switching cycle Tsw(n) and greater than a charge-side threshold Vγ(n−1) in the previous switching cycle tsw(n−1). Here, the process at step S92 corresponds to the on-time estimating unit.

At subsequent step S93, whether the on-surge voltage Vonsr that is estimated in the current switching cycle Tsw(n) is equal to the withstand voltage threshold Vlim is determined.

When determined that the on-surge voltage is equal to the withstand voltage threshold Vlim at step S93, the drive control unit 56 proceeds to step S94 and maintains the charge resistance value Rcha in the next switching cycle Tsw(n+1) at a same value as the charge resistance value Rcha in the current switching cycle Tsw(n).

When determined that the on-surge voltage is not equal to the withstand voltage threshold Vlim at step S93, the drive control unit 56 proceeds to step S95 and determines whether the on-surge voltage Vonsr is less than the withstand voltage threshold Vlim.

When determined that the on-surge voltage Vonsr is less at step S95, the drive control unit 56 proceeds to step S96, and sets the charge resistance value Rcha in the next switching cycle Tsw(n+1) to be lower than the charge resistance value Rcha in the current switching cycle Tsw(n).

At step S97, the charge-side threshold Vγ(n+1) in the next switching cycle Tsw(n+1) is set to a value that is obtained by the predetermined value X being added to the charge-side threshold Vγ(n) in the current switching cycle Tsw(n). However, the upper limit value of the charge-side threshold Vγ is the withstand voltage threshold Vlim.

When a negative determination is made at step S95, the drive control unit 56 determines that the on-surge voltage Vonsr is greater than the withstand voltage threshold Vlim and proceeds to step S98. At step S98, the charge resistance value Rcha in the next switching cycle Tsw(n+1) is increased from the charge resistance value Rcha in the current switching cycle Tsw(n).

According to the present embodiment, as a result of the processes at steps S93 to S98, the charge resistance value Rcha is charged such that the on-surge voltage Vonsr becomes the withstand voltage threshold Vlim.

Figure 20:
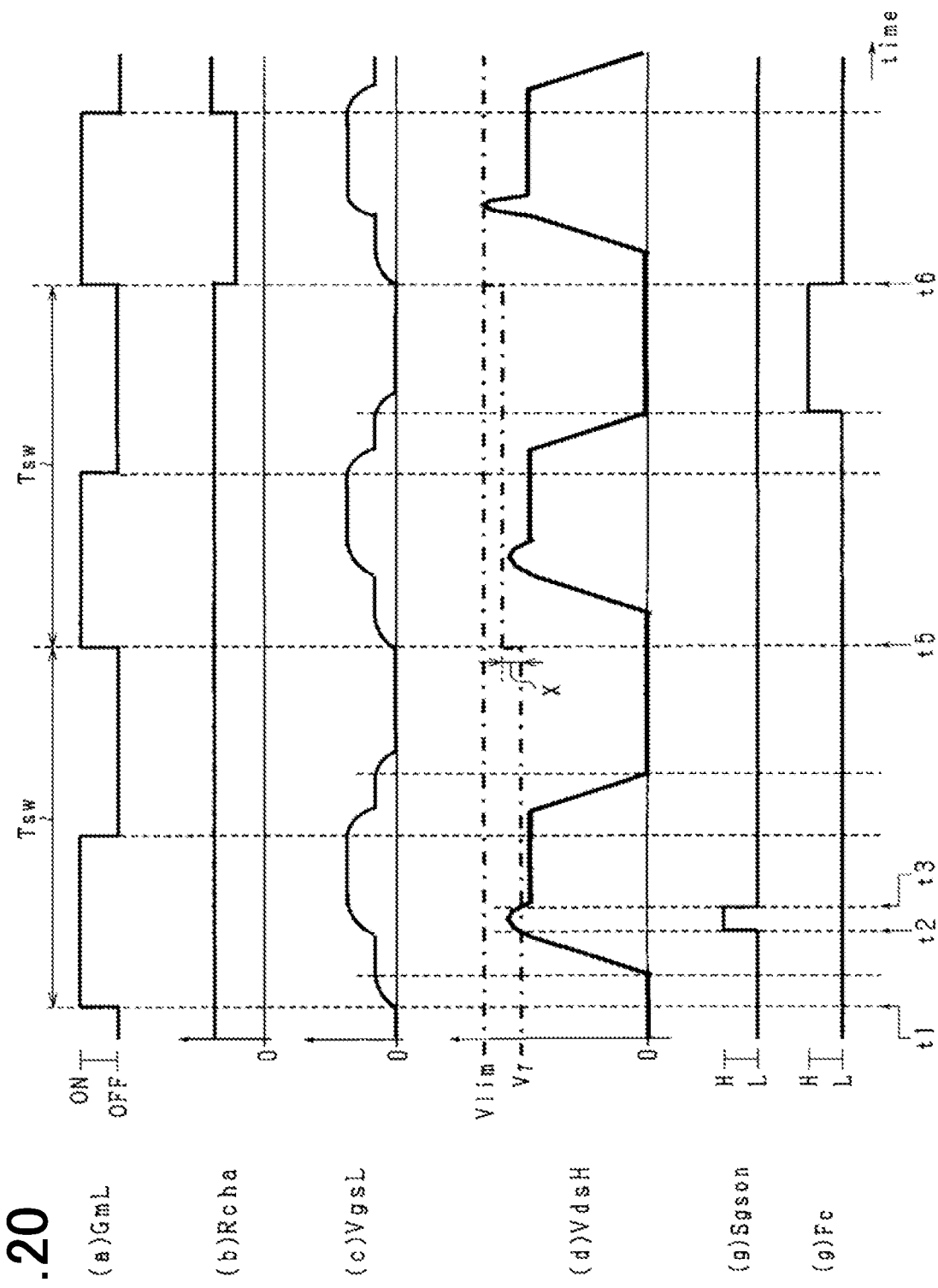
FIG. 20 is a timing chart illustrating an aspect of the active gate process.

An example of the active gate process during the on-state will be described with reference to FIG. 20. FIG. 20(a) to (c) correspond to FIG. 7(a) to (c) above. FIG. 20(d) shows transitions in the drain-source voltage VdsH of the upper arm switch SWH. FIG. 20(e) shows transitions in the charge-side signal Sgson. FIG. 20(f) shows transitions in a flag Fc that is used in changing of the charge resistance value Rcha.

At time t1, the lower-arm gate signal GmL is switched to the on-command. Subsequently, at time t2 to t3, the logic of the charge-side signal Sgson is set to H. Therefore, at time t5 in the subsequent switching cycle Tsw, the charge-side threshold Vγ is increased by the predetermined value X. In the switching cycle Tsw from time t5, the logic of the charge-side signal Sgson is not inverted to H.

Therefore, a determination result in which the charge-side signal Sgson in the previous switching cycle Tsw is used and a determination result in which the charge-side signal Sgson in the current switching cycle Tsw is used differ. Consequently, the on-surge voltage Vonsr is estimated to be a value that is less than the charge-side threshold Vγ(n) in the current switching cycle Tsw and greater than the charge-side threshold Vγ(n−1) in the previous switching cycle Tsw. In addition, based on the estimated on-surge voltage Vonsr, the charge resistance value Rcha at and subsequent to time t6 is decreased.

Furthermore, in the switching cycle Tsw from time t5, although the logic of the charge-side signal Sgson is not inverted to H, the charge-side threshold Vγ is less than the withstand voltage threshold Vlim. Therefore, in the example shown in FIG. 21, the charge-side threshold Vγ in the switching cycle Tsw from time t6 is set to the same value as the withstand voltage threshold Vlim as a result of being increased.

According to the present embodiment described above, effects similar to those according to the first embodiment can be obtained.

Variation Example According to the Sixth Embodiment

As the configuration for estimating the on-surge voltage Vonsr according to the sixth embodiment, a configuration similar to that in the variation example 1 according to the third embodiment may be used.

In addition, as the configuration for estimating the on-surge voltage Vonsr according to the sixth embodiment, a configuration similar to that in the variation example 2 according to the third embodiment may be used. In this case, for example, first to third charge-side thresholds Vγ1 to Vγ3 that differ from one another may be set as the charge-side thresholds with reference to FIG. 13 and FIG. 14.

Seventh Embodiment

A seventh embodiment will be described below with reference to the drawings, mainly focusing on differences with the fifth embodiment. According to the present embodiment, the active gate during on-state is modified. Therefore, the lower-arm drive IC 50L includes the first comparator 90a, the second comparator 90b, the first power supply 91a, and the second power supply 91b shown in FIG. 15 above. However, according to the present embodiment, the first discharge-side threshold Val is inputted from the first power supply 91a to the non-inverting input terminal of the first comparator 90a. The second discharge-side threshold Vα2 is inputted from the second power supply 91b to the non-inverting input terminal of the second comparator 90b. In addition, the analog voltage that is outputted from the detection circuit 60 is inputted to the inverting input terminals of the first and second comparators 90a and 90b.

Figure 21:
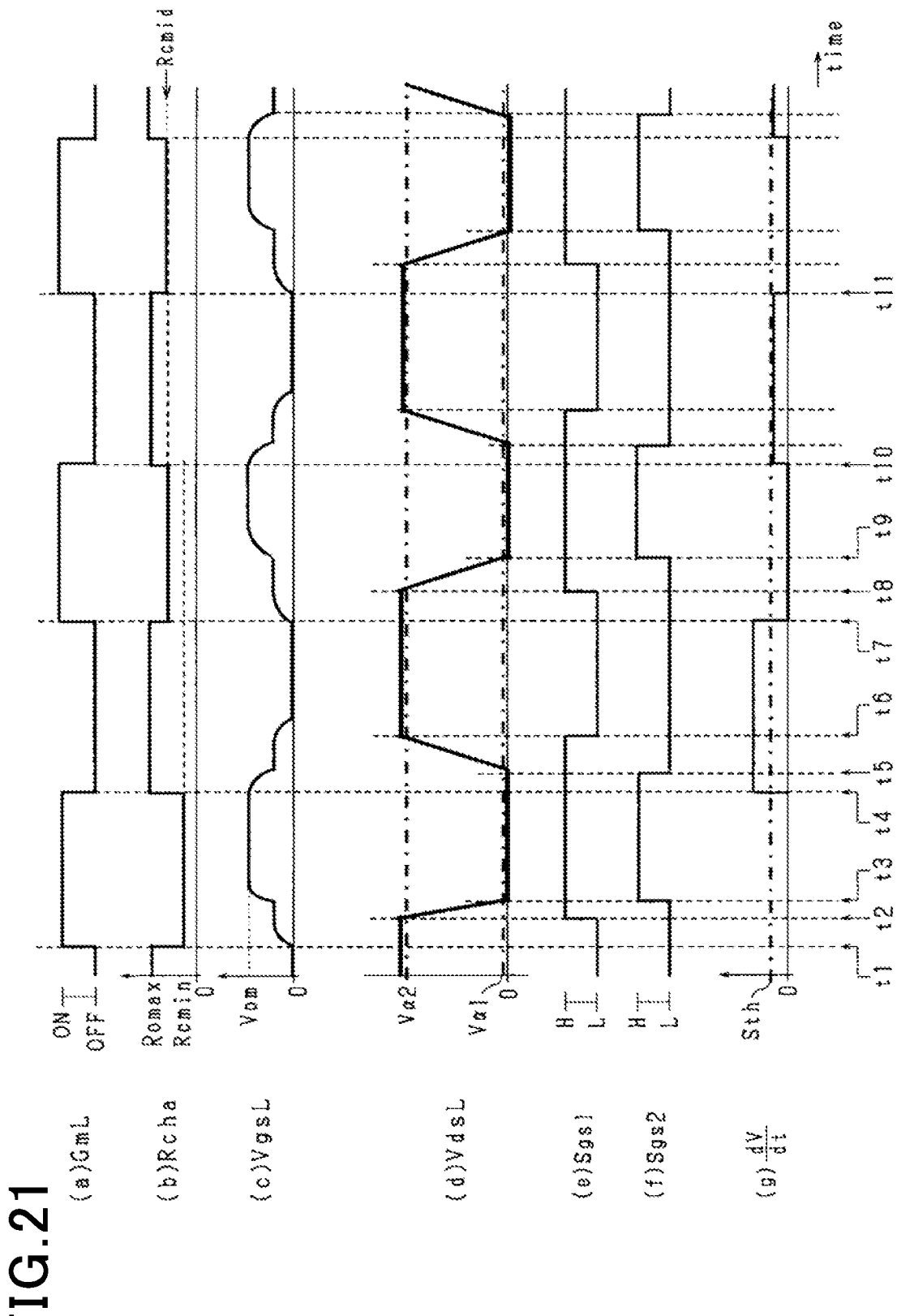
FIG. 21 is a timing chart illustrating an aspect of an active gate process according to a seventh embodiment.

The active gate process performed by the drive control unit 56 of the lower-arm drive IC 50L will be described with reference to FIG. 21. FIG. 21(a) to (c) correspond to FIG. 20(a) to (c) above. FIG. 21(d) shows transitions in the drain-source voltage VdsL of the lower arm switch SWL. FIGS. 21(e) and (f) show transitions in the first and second discharge-side signals Sgs1 and Sgs2. FIG. 21(g) show a decrease speed dV/dt of the drain-source voltage VdsL of the lower arm switch SWL when the lower arm switch SWL is switched to the on-state. Here, according to the present embodiment, the drive control unit 56 includes an on-time speed calculating unit.

At time t1, the lower-arm gate signal GmL is switched to the on-command. Therefore, at time t2, the logic of the first discharge-side signal Sgs1 is inverted to H. At time t3, the logic of the second discharge-side signal Sgs2 is inverted to H. A timing at which the logic of the first discharge-side signal Sgs1 is inverted to H can be determined to be a timing that is equal to a start timing of a Miller period that appears when the lower arm switch SWL is switched to the on-state. A timing at which the logic of the second discharge-side signal Sgs2 is inverted to H can be determined to be a timing that is equal to the end timing of the Miller period.

The drive control unit 56 calculates the decrease speed dV/dt in a manner similar to that in expression (eq1) above, based on the period TM from time t2 to t3 and the difference between the first discharge-side threshold Vβ1 and the second discharge-side threshold Vβ2.

Subsequently, at time t4 at which the lower-arm gate signal GmL is switched to the off-command, the drive control unit 56 determines that the calculated decrease speed dV/dT is greater than a speed threshold Sth thereof. Therefore, the drive control unit 56 increases the charge resistance value Rcha in the next switching cycle Tsw from time t7.

At time t5, the logic of the second discharge-side signal Sgs2 is inverted to L. At time t6, the logic of the first discharge-side signal Sgs1 is inverted to L.

At time t7, the lower-arm gate signal GmL is switched to the on-command. Therefore, at time t8, the logic of the first discharge-side signal Sgs1 is inverted to H. At time t9, the logic of the second discharge-side signal Sgs2 is inverted to H. The drive control unit 56 calculates the decrease speed dV/dt based on the period TM from time t8 to t9, and the difference between the first discharge-side threshold Vβ1 and the second discharge-side threshold Vβ2.

At time t10 when the lower-arm gate signal GmL is switched to the off-command, the drive control unit 56 determines that the calculated decrease speed dV/dt is equal to the speed threshold Sth. Therefore, the drive control unit 56 maintains the charge resistance value Rcha in the next switching cycle Tsw from time t11 at the charge resistance value Rcha in the current switching cycle Tsw.

According to the present embodiment described above, the decrease speed dV/dt during the Miller period becoming excessively high can be suppressed. As a result, noise that is generated in accompaniment with switching of the lower arm switch SWL to the on-state can be reduced. Decrease in electromagnetic compatibility (EMC) characteristics can be suppressed.

Other Embodiments

Here, the above-described embodiments may be modified in the following manner.

The configuration may be such that the output voltage of the negative-side output terminal, instead of the positive-side output terminal of the fully-differential amplifier circuit 63 in FIG. 3, is inputted to, for example, the non-inverting input terminal of the comparator 70 in FIG. 2. When the output voltage of the negative-side output terminal and the output voltage of the positive-side output terminal differ, a latter-stage circuit configuration may be modified based on the difference.

The detection circuit is not limited to that which includes the fully-differential amplifier circuit and may be that which includes a differential amplifier circuit. Hereafter, an example of this circuit configuration will be described.

As shown in FIG. 22, the detection circuit 60 includes an input capacitor 131, a hold capacitor 132, a differential amplifier circuit 133, and a reset switch 134. The input capacitor 131 is connected to the drain of the lower arm switch SWL and an inverting input terminal (corresponding to the first input terminal) of the differential amplifier circuit 133. A first end of the hold capacitor 132 is connected to the inverting input terminal. An output terminal of the differential amplifier circuit 133 is connected to a second end of the hold capacitor 132. The source of the lower arm switch SWL is connected to a non-inverting input terminal (corresponding to the second input terminal) of the differential amplifier circuit 133.

The reset switch 134 is arranged in parallel with the hold capacitor 132. Reset is executed by the reset switch 134 being switched to the on-state. Subsequently, reset is canceled when the reset switch 134 is switched to the off-state.

In the configurations shown in FIG. 3 and FIG. 22, the differential amplifier circuit may be configured as an inverting amplifier circuit rather than a non-inverting amplifier circuit. In this case, a latter-stage circuit configuration may be modified based on this modification.

The power converter is not limited to an inverter. For example, the power converter may be a full-bridge circuit that includes two sets of series-connection bodies composed of the upper and lower arm switches.

As shown in FIG. 4(d), the execution and cancelation of reset may be performed during a period TR12 in which the lower arm switch SWL is set to the off-state, and the surge voltage and ringing of the drain-source voltage VdsL are converged. In this case, the execution and canceling of reset may be performed at the timing at which the lower-arm gate signal GmL is switched to the on-command.

As shown in FIG. 23, according to the first to fourth embodiments, the drive control unit 56 may perform a masking process such that, when the period in which the lower-arm gate signal GmL is set to the off-command is determined to be shorter than a voltage transition period from when the drain-source voltage of the lower arm switch SWL starts to change (increase) after the lower-arm gate signal GmL is switched to the off-command until the change is converged and the drain-source voltage becomes the power supply voltage VDC, the analog voltage that is outputted from the detection circuit 60 during the Miller period of the lower arm switch SWL is not used in the active gate process.

In addition, the drive control unit 56 may perform a masking process such that, when the period in which the lower-arm gate signal GmL is set to the off-command is determined to be shorter than a period from when the lower-arm gate signal GmL is switched to the off-command until the surge voltage that is generated in accompaniment with the switching of the lower arm switch SWL to the off-state is converged, the analog voltage that is outputted from the detection circuit 60 during the period in which the surge voltage is generated is not used in the active gate process. Here, at this time, execution and cancelation of reset may be prohibited.

Furthermore, according to the fifth to eighth embodiments, the drive control unit 56 may perform a masking process such that, when the period in which the lower-arm gate signal GmL is set to the on-command is determined to be shorter than a period from when the drain-source voltage of the lower arm switch SWL starts to change (decrease) after the lower-arm gate signal GmL is switched to the on-command until the change is converged and the drain-source voltage becomes 0, the analog voltage that is outputted from the detection circuit 100 during the Miller period of the lower arm switch SWL is not used in the active gate process.

In addition, the drive control unit 56 may perform a masking process such that, when the period in which the lower-arm gate signal GmL is set to the on-command is determined to be shorter than a period from when the lower-arm gate signal GmL is switched to the on-command until the surge voltage that is generated in accompaniment with the switching of the lower arm switch SWL to the on-state is converged, the analog voltage that is outputted from the detection circuit 100 during the period in which the surge voltage is generated is not used in the active gate process. Here, at this time, execution and cancelation of reset may be prohibited.

As a result of the configurations above, erroneous detection in the drive control unit 56 can be prevented.

As shown in FIG. 24, when the analog voltage that is outputted from the detection circuit 60 is determined to cross over the discharge-side threshold Vα three or more times during the period in which the off-command is set, the drive control unit 45 may prohibit use of the discharge-side signals at and subsequent to a timing at which the analog voltage crosses over the discharge-side threshold Vα the third time in the active gate process.

The configuration for changing the discharging rate and the charging rate of the gate charge is not limited to that in which the resistance value of the resistor is changed. For example, using the configuration in FIG. 2 as an example, the discharging rate may be increased by the output voltage of the power supply 51 being increased, or the discharging rate may be increased by an electric potential at the ground portion that is connected to the source side of the discharge switch 55 being decreased.

In addition, when the drive IC includes a plurality of current sources of which output current values differ or a current source of which the output current value is variable, the charging rate of the gate charge may be changed by the output current value being changed. Moreover, when the drive IC includes a plurality of current sources of which values of currents to be drawn differ or a current source of which the value of the current to be drawn is variable, the discharging rate of the gate charge may be changed by the output current value being changed.

The control unit and the method thereof described in the present disclosure may be implemented by a dedicated computer that is provided so as to be configured by a processor and a memory, the processor being programmed to provide one or a plurality of functions that are realized by a computer program. Alternatively, the control unit and the method thereof described in the present disclosure may be implemented by a dedicated computer that is provided by a processor being configured by a single dedicated hardware logic circuit or more.

Still alternatively, the control unit and the method thereof described in the present disclosure may be implemented by a single dedicated computer or more, the dedicated computer being configured by a combination of a processor that is programmed to provide one or a plurality of functions, a memory, and a processor that is configured by a single hardware logic circuit or more. In addition, the computer program may be stored in a non-transitory tangible recording medium that can be read by a computer as instructions performed by the computer.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

What is claimed is:

1. A drive circuit for a switch that configures a power converter, the drive circuit comprising:
    a voltage divider that divides an inter-terminal voltage of the switch; and
    a differential circuit that has a first input terminal and a second input terminal to which the inter-terminal voltage that is divided by the voltage divider is input, and outputs an analog voltage that is based on a voltage difference between the first input terminal and the second input terminal, wherein
    the differential circuit provides a function for executing reset of the output voltage thereof, and with a voltage difference between the first input terminal and the second input terminal when reset is canceled after reset is executed as a reference voltage, outputs an analog voltage in which an amount of change from the reference voltage is multiplied by an amplification factor, and
    the drive circuit further includes
        a comparator that outputs a binary signal based on a comparison result between a threshold and the analog voltage that is output from the differential circuit, and
        a gate control unit that sets a transfer rate of a gate charge of the switch when a driving state of the switch is switched from either of an off-state and an on-state to the other state, based on the output signal of the comparator.

2. The drive circuit for a switch according to claim 1, wherein:
    the comparator is a discharge-side comparator that outputs a binary signal based on a comparison result between the analog voltage that is output from the differential circuit and a discharge-side threshold that serves as the threshold; and
    the gate control unit is a discharge control unit that sets a discharging rate of the gate charge of the switch when the switch is switched to the off-state, based on the output signal of the discharge-side comparator.

3. The drive circuit for a switch according to claim 2, wherein:
    the discharge-side threshold is
        a first discharge-side threshold that is a positive number approximately equal to 0, and
        a second discharge-side threshold that is a value that is greater than the first discharge-side threshold and approximately equal to the analog voltage that is output from the differential circuit when a power supply voltage of the power converter is applied to the switch;
    the discharge-side comparator includes
        a first discharge-side comparator that outputs a first discharge-side signal that is a binary signal that is based on a comparison result between the first discharge-side threshold and the analog voltage that is output from the differential circuit, and
        a second discharge-side comparator that outputs a second discharge-side signal that is a binary signal that is based on a comparison result between the second discharge-side threshold and the analog voltage that is output from the differential circuit,
    the drive circuit includes a period detecting unit that detects a Miller period of the switch that appears when the switch is switched to the off-state based on the first discharge-side signal that is output from the first discharge-side comparator and the second discharge-side signal that is output from the second discharge-side comparator; and the discharge control unit sets the discharging rate at and subsequent to an end timing of the detected Miller period to be lower than the discharging rate during a period from a start timing of an off-command of the switch to a start timing of the detected Miller period.

4. The drive circuit for a switch according to claim 2, wherein:

the discharge-side threshold is a value that is greater than 0 and approximately equal to the analog voltage that is output from the differential circuit when a power supply voltage of the power converter is applied to the switch;

the drive circuit includes a timing detecting unit that detects an end timing of a Miller period of the switch that appears when the switch is switched to the off-state, based on the output signal of the discharge-side comparator; and the discharge control unit sets the discharging rate at and subsequent to the end timing detected by the timing detecting unit to be lower than the discharging rate during a period from a start timing of an off-command of the switch to the end timing detected by the timing detecting unit.

5. The drive circuit for a switch according to claim 2, wherein:

the discharge-side threshold is a value that is greater than 0 and approximately equal to the analog voltage that is output from the differential circuit when a power supply voltage of the power converter is applied to the switch, or is the analog voltage that is output from the differential circuit when the inter-terminal voltage of the switch is an allowable upper-limit value thereof;

the drive circuit includes an off-time estimating unit that estimates a surge voltage that is generated when the switch is switched to the off-state, based on the output signal of the discharge-side comparator; and the discharge control unit sets the discharging rate during a period from a start timing of an off-command of the switch to a timing at which a logic of the output signal of the discharge-side command unit is inverted to be lower than the discharging rate at and subsequent to the timing at which the logic is inverted, and changes the discharging rate at and subsequent to the timing at which the logic is inverted based on the surge voltage that is estimated by the off-time estimating unit.

6. The drive circuit for a switch according to claim 5, wherein:

the off-time estimating unit detects a period in which the analog voltage that is output from the differential circuit exceeds the discharge-side threshold based on the output signal of the discharge-side comparator, and estimates the surge voltage that is generated when the switch is switched to the off-state based on the detected period and a current that flows to the switch.

7. The drive circuit for a switch according to claim 2, wherein:

the discharge threshold is a value that is greater than 0 and approximately equal to the analog voltage that is output from the differential circuit when a power supply voltage of the power converter is applied to the switch, or is the analog voltage that is output from the differential circuit when the inter-terminal voltage of the switch is an allowable upper-limit value thereof; and the discharge control unit detects a period in which the analog voltage that is output from the differential circuit exceeds the discharge-side threshold based on the output signal of the discharge-side comparator, and sets the discharging rate during the detected period within a period from a start timing of an off-command of the switch until the switch is switched to the off-state to be lower than the discharging rate during other periods.

8. The drive circuit for a switch according to claim 2, wherein:

the discharge control unit sets the discharging rate at and subsequent to an end timing of a Miller period of the switch to be lower than the discharging rate during a period from a start timing of an off-command of the switch to a start timing of the Miller period;

the drive circuit includes a discharge threshold changing unit that increases the discharge-side threshold in a next switching to be greater than the discharge-side threshold in a current switching cycle when the analog voltage that is output from the differential circuit in the current switching cycle is determined to exceed the discharge-side threshold based on the output signal of the discharge-side comparator, and an off-time estimating unit that, when a determination result regarding whether the analog voltage that is output from the differential circuit exceeds the discharge-side threshold in a previous switching cycle and a determination result regarding whether the analog voltage that is output from the differential circuit exceeds the discharge-side threshold in the current switching cycle differ, estimates that a surge voltage that corresponds to an intermediate value between the discharge-side threshold in the previous switching cycle and the discharge-side threshold in the current switching cycle is generated in the current switching cycle, as the surge voltage that is generated when the switch is switched to the off-state; and the discharge control unit changes the discharging rate at and subsequent to the end timing of the Miller period based on the surge voltage that is estimated by the off-time estimating unit.

9. The drive circuit for a switch according to claim 2, wherein:

the discharge control unit sets the discharging rate at and subsequent to an end timing of a Miller period of the switch to be lower than the discharging rate during a period from a start timing of an off-command of the switch to a start timing of the Miller period;

the discharge-side threshold is a plurality of discharge-side thresholds that include a value that is approximately equal to the analog voltage that is output from the differential circuit when a power supply voltage of the power converter is applied to the switch, and that differ from one another;

the discharge-side comparator outputs a binary signal based on a comparison result between the discharge-side threshold and the analog voltage that is output from the differential circuit, for each of the plurality of discharge-side thresholds;

the drive circuit includes an off-time estimating unit that estimates that a surge voltage that corresponds to an intermediate value between the discharge-side threshold a pair of discharge-side thresholds that sandwich the analog voltage is generated in a current switching cycle, as the surge voltage that is generated when the switch is switched to the off-state, based on the output signal of the discharge-side comparator; and the discharge control unit changes the discharging rate at and subsequent to the end timing of the Miller period based on the surge voltage that is estimated by the off-time estimating unit.

10. The drive circuit for a switch according to claim 8, wherein:

in response to the analog voltage that is output from the differential circuit when the inter-terminal voltage of the switch is an allowable upper-limit value thereof being a withstand voltage threshold, the discharge control unit changes the discharging rate at and subsequent to the end timing of the Miller period such that the surge voltage that is estimated by the off-time estimating unit becomes the withstand voltage threshold.

11. The drive circuit for a switch according to claim 2, wherein:

the discharge-side threshold is
  a first discharge-side threshold that is a positive number approximately equal to 0, and
  a second discharge-side threshold that is a value that is greater than the first discharge-side threshold and approximately equal to the analog voltage that is output from the differential circuit when a power supply voltage of the power converter is applied to the switch;
the discharge-side comparator includes
  a first discharge-side comparator that outputs a first discharge-side signal that is a binary signal that is based on a comparison result between the first discharge-side threshold and the analog voltage that is output from the differential circuit, and
  a second discharge-side comparator that outputs a second discharge-side signal that is a binary signal that is based on a comparison result between the second discharge-side threshold and the analog voltage that is output from the differential circuit;
the drive circuit includes an off-time speed calculating unit that calculates an increase speed of the inter-terminal voltage of the switch when the switch is switched to the off-state, based on the first discharge-side signal that is output from the first discharge-side comparator and the second discharge-side signal that is output from the second discharge-side comparator; and
the discharge control unit changes the discharging rate based on the increase speed that is calculated by the off-time speed calculating unit.

12. The drive circuit for a switch according to claim 11, wherein:

the off-time speed calculating unit detects a period from when the analog voltage that is output from the differential circuit exceeds the first discharge-side threshold until the analog voltage exceeds the second discharge-side threshold after a start timing of an off-command of the switch, based on the first discharge-side signal that is output from the first discharge-side comparator and the second discharge-side signal that is output from the second discharge-side comparator, and calculates the increase speed based on the detected period and a difference between the first discharge-side threshold and the second discharge-side threshold.

13. The drive circuit for a switch according to claim 2, wherein:

the discharge control unit sets the discharging rate during a detected Miller period to be lower than the discharging rate during a period from a start timing of an off-command of the switch to a start timing of the detected mirror period.

14. The drive circuit for a switch according to claim 2, wherein:

the discharge control unit sets the discharging rate during a detected Miller period to be higher than the discharging rate at and subsequent to an end timing of the detected Miller period.

15. The drive circuit for a switch according to claim 1, wherein:

the switch is an upper arm switch and a lower arm switch that are connected in series and alternately set to the on-state;
diodes are respectively connected in reverse parallel to the upper arm switch and the lower arm switch;
of the upper arm switch and the lower arm switch, when the switch that is to be switched to the on-state is an own arm switch and the remaining switch is an opposing arm switch, the voltage divider divides the inter-terminal voltage of the opposing arm switch;
the comparator is a charge-side comparator that outputs a binary signal based on a comparison result between the analog voltage that is output from the differential circuit and a charge-side threshold that serves as the threshold; and
the gate control unit is a charge control unit that sets a charging rate of the gate charge of the own arm switch when the own arm switch is switched to the on-state, based on the output signal of the charge-side comparator.

16. The drive circuit for a switch according to claim 15, wherein:

the charge-side threshold is a value that is greater than 0 and approximately equal to the analog voltage that is output from the differential circuit when a power supply voltage of the power converter is applied to the opposing arm switch, or is the analog voltage that is output from the differential circuit when the inter-terminal voltage of the opposing arm switch is an allowable upper-limit value thereof;
the drive circuit includes an on-time estimating unit that estimates a surge voltage that is generated when the own arm switch is switched to the on-state, based on the output signal of the charge-side comparator; and
the charge control unit changes the charging rate based on the surge voltage that is estimated by the on-time estimating unit.

17. The drive circuit for a switch according to claim 16, wherein the on-estimating unit detects a period in which the analog voltage that is output from the differential circuit exceeds the charge-side threshold based on the output signal of the charge-side comparator, and estimates the surge voltage that is generated when the own arm switch is switched to the on-state based on the detected period and a current that flows to the switch.

18. The drive circuit for a switch according to claim 15, further comprising:

a charge threshold changing unit that increases the charge-side threshold in a next switching cycle to be greater than the charge-side threshold in a current switching cycle when the analog voltage that output from the differential circuit in the current switching cycle is determined to exceed the charge-side threshold based on the output signal of the charge-side comparator; and an on-time estimating unit that, when a determination result regarding whether the analog voltage that is output from the differential circuit exceeds the charge-side threshold in a previous switching cycle and a determination result regarding whether the analog voltage that is output from the differential circuit exceeds the charge-side threshold in the current switching cycle differ, estimates that a surge voltage that corresponds to an intermediate value between the charge-side threshold in the previous switching cycle and the charge-side threshold in the current switching cycle is generated in the current switching cycle, as the surge voltage that is generated when the own arm switch is switched to the on-state, wherein the charge control unit changes the charging rate based on the surge voltage that is estimated by the on-time estimating unit.

19. The drive circuit for a switch according to claim 15, wherein:

the charge-side threshold is a plurality of charge-side thresholds that include a value that is approximately equal to the analog voltage that is output from the differential circuit when a power supply voltage of the power converter is applied to the opposing arm switch, and that differ from one another;

the charge-side comparator outputs a binary signal based on a comparison result between the charge-side threshold and the analog voltage that is output from the differential circuit, for each of the plurality of charge-side thresholds;

the drive circuit includes an on-time estimating unit that estimates that a surge voltage that corresponds to an intermediate value between a pair of charge-side thresholds that sandwich the analog voltage is generated in a current switching cycle, as the surge voltage that is generated when the own arm switch is switched to the on-state, based on the output signal of the charge-side comparator; and the charge control unit changes the charging rate based on the surge voltage that is estimated by the on-time estimating unit.

20. The drive circuit for a switch according to claim 18, wherein:

in response to the analog voltage that is output from the differential circuit when the inter-terminal voltage of the opposing arm switch is an allowable upper-limit value thereof being a withstand voltage threshold, the charge control unit changes the charging rate such that the surge voltage that is estimated by the on-time estimating unit is the withstand voltage threshold.

21. The drive circuit for a switch according to claim 15, wherein;

the threshold comprises
a first discharge-side threshold that is a positive number approximately equal to 0, and
a second discharge-side threshold that is a value that is greater than the first discharge-side threshold and approximately equal to the analog voltage that is output from the differential circuit that corresponds to the own arm switch when a power supply voltage of the power converter is applied to the switch;

the comparator includes
a first discharge-side comparator that outputs a first discharge-side signal that is a binary signal that is based on a comparison result between the first discharge-side threshold and the analog voltage that is output from the differential circuit that corresponds to the own arm switch, and a second discharge-side comparator that outputs a second discharge-side signal that is a binary signal that is based on a comparison result between the second discharge-side threshold and the analog voltage that is output from the differential circuit that corresponds to the own arm switch;

the drive circuit includes an on-time speed calculating unit that calculates a decrease speed of the inter-terminal voltage of the own arm switch when the own arm switch is switched to the off-state, based on the first discharge-side signal that is output from the first discharge-side comparator and the second discharge-side signal that is output from the second discharge-side comparator; and the charge control unit changes the charging rate based on the decrease speed that is calculated by the on-time speed calculating unit.

22. The drive circuit for a switch according to claim 21, wherein:

the on-time speed calculating unit detects a period from when the analog voltage that is output from the differential circuit that corresponds to the own arm switch falls below the second discharge-side threshold until the analog voltage falls below the first discharge-side threshold after a start timing of an on-command of the own arm switch, based on the first discharge-side signal that is output from the first discharge-side comparator and the second discharge-side signal that is output from the second discharge-side comparator, and calculates the decrease speed based on the detected period and a difference between the first discharge-side threshold and the second discharge-side threshold.

23. The drive circuit for a switch according to claim 1, wherein:

execution of reset and cancelation of reset are performed during a period in which the switch is set to the on-state and after surge and ringing of the analog voltage that occur in accompaniment with the switching of the switch to the on-state are converged, or during a period in which the switch is set to the off-state and after surge and ringing of the analog voltage that occur in accompaniment with the switching of the switch to the off-state are converged.

24. The drive circuit for a switch according to claim 1, wherein:

in response to a period in which an off-command of the switch is set or a period in which an on-command of the switch is set being determined to be shorter than a period from when the inter-terminal voltage of the switch starts to change in accompaniment with the switching of the driving state of the switch until the change is completed, the analog voltage that is output from the differential circuit during a Miller period of the switch is prohibited from being used in the gate control unit.

25. The drive circuit for a switch according to claim 1, wherein:

in response to a period in which an off-command of the switch is set or a period in which an on-command of the switch is set being determined to be shorter than a period in which a surge voltage that is generated in accompaniment with the switching of the driving state of the switch is converged, the analog voltage that is output from the differential circuit during a period in which the surge voltage is generated is prohibited from being used in the gate control unit.

26. The drive circuit for a switch according to claim 1, wherein:
in response to the analog voltage being determined to cross over the threshold three or more times in a single switching cycle of the switch, the output signal of the comparator at and subsequent to a timing at which the analog voltage crosses over the threshold the third time is prohibited from being used in the gate control unit.

27. The drive circuit for a switch according to claim 1, wherein:
the voltage divider includes
a first input capacitor that connects a high-potential-side terminal of the switch and the first input terminal,
a second input capacitor that connects a low-potential-side terminal of the switch and the second input terminal,
a first hold capacitor of which a first end is connected to the first input terminal, and
a second hold capacitor of which a first end is connected to the second input terminal;
the differential circuit includes
a fully-differential amplifier circuit that has a first output terminal to which a second end of the first hold capacitor is connected, and a second output terminal to which a second end of the second hold capacitor is connected,
a first reset switch that is in parallel with the first hold capacitor, and
a second reset switch that is in parallel with the second hold capacitor; and
reset is executed by each of the first reset switch and the second reset switch being switched to an on-state, and reset is canceled by each of the first reset switch and the second reset switch being subsequently switched to an off-state.

28. The drive circuit for a switch according to claim 1, wherein:
the voltage divider includes
an input capacitor that connects a high-potential-side terminal of the switch and the first input terminal, and
a hold capacitor of which a first end is connected to the first input terminal; and
the differential circuit includes
a differential amplifier circuit that includes an output terminal to which a second end of the hold capacitor is connected; and
a reset switch that is in parallel with the hold capacitor; and
reset is executed by the reset switch being switched to an on-state and reset is canceled by the reset switch being subsequently switched to an off-state.

* * * * *